(12) United States Patent
Ino

(10) Patent No.: US 8,866,139 B2
(45) Date of Patent: Oct. 21, 2014

(54) NONVOLATILE SEMICONDUCTOR MEMORY DEVICE

(71) Applicant: Tsunehiro Ino, Kanagawa (JP)

(72) Inventor: Tsunehiro Ino, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/727,027

(22) Filed: Dec. 26, 2012

(65) Prior Publication Data

US 2013/0234130 A1 Sep. 12, 2013

(30) Foreign Application Priority Data

Mar. 8, 2012 (JP) ................................. 2012-051492

(51) Int. Cl.

| H01L 29/792 | (2006.01) |
|---|---|
| H01L 29/788 | (2006.01) |
| H01L 29/51 | (2006.01) |
| H01L 29/423 | (2006.01) |
| H01L 29/66 | (2006.01) |
| B82Y 10/00 | (2011.01) |

(52) U.S. Cl.
CPC .......... *H01L 29/792* (2013.01); *H01L 29/7881* (2013.01); *H01L 29/513* (2013.01); *H01L 29/42348* (2013.01); *H01L 29/42332* (2013.01); *H01L 29/66833* (2013.01); *B82Y 10/00* (2013.01); *H01L 29/7926* (2013.01); *H01L 29/66825* (2013.01); *H01L 29/7889* (2013.01); *Y10S 977/943* (2013.01)
USPC ........................................... 257/43; 977/943

(58) Field of Classification Search
USPC ........................................................ 257/43
See application file for complete search history.

(56) References Cited

U.S. PATENT DOCUMENTS

| 4,112,509 | A * | 9/1978 | Wall ......................... 365/185.29 |
|---|---|---|---|
| 6,472,705 | B1 | 10/2002 | Bethune et al. |
| 7,915,668 | B2 * | 3/2011 | Kolake et al. ................. 257/325 |
| 2008/0096306 | A1 * | 4/2008 | Kolake et al. .................... 438/99 |
| 2008/0277719 | A1 | 11/2008 | Choi et al. |
| 2008/0296662 | A1 | 12/2008 | Poeppel et al. |
| 2009/0308458 | A1 | 12/2009 | Aramaki et al. |
| 2011/0241101 | A1 | 10/2011 | Ino et al. |
| 2012/0012919 | A1 * | 1/2012 | Kan et al. ...................... 257/316 |
| 2012/0019368 | A1 * | 1/2012 | Brommer et al. .......... 340/10.42 |
| 2013/0338292 | A1 * | 12/2013 | Fujita et al. ................... 524/430 |

FOREIGN PATENT DOCUMENTS

| JP | 2002-231834 | 8/2002 |
|---|---|---|
| JP | 2004-288930 A | 10/2004 |
| JP | 2008-135622 A | 6/2008 |
| JP | 2010-056492 A | 3/2010 |
| WO | 2008/114782 A1 | 9/2008 |

OTHER PUBLICATIONS

Notification of Reason(s) for Refusal in patent application No. 2012-051492, drafting date Aug. 5, 2014 with English translation.

* cited by examiner

*Primary Examiner* — Thao P Le
(74) *Attorney, Agent, or Firm* — Oblon, Spivak, McClelland, Maier & Neustadt, L.L.P.

(57) ABSTRACT

A nonvolatile semiconductor memory device of an embodiment includes: a semiconductor layer; a first insulating film formed on the semiconductor layer; a charge storage film that is formed on the first insulating film, includes C60 fullerenes, and is not less than 0.5 monolayer but is less than 1.0 monolayer; a second insulating film formed on the charge storage film; and a control electrode formed on the second insulating film.

23 Claims, 13 Drawing Sheets

US 8,866,139 B2

NONVOLATILE SEMICONDUCTOR MEMORY DEVICE

CROSS-REFERENCE TO RELATED APPLICATION

This application is based upon and claims the benefit of priority from Japanese Patent Application No. 2012-051492, filed on Mar. 8, 2012, the entire contents of which are incorporated herein by reference.

FIELD

Embodiments described herein relate generally to nonvolatile semiconductor memory devices.

BACKGROUND

As scaling down of devices progresses, nonvolatile semiconductor memory devices are becoming smaller in size. Among nonvolatile semiconductor memory devices, there are floating-gate type devices and MONOS (Metal Oxide Nitride Oxide Silicon) type devices each having a charge storage film for storing charges into memory cells.

As the devices are becoming smaller, the charge storage film is expected to become thinner while maintaining high charge storage properties, so as to facilitate manufacturing and restrain interactions between adjacent cells.

DETAILED DESCRIPTION

A nonvolatile semiconductor memory device of an embodiment includes: a semiconductor layer; a first insulating film formed on the semiconductor layer; a charge storage film that is formed on the first insulating film, includes C60 fullerenes, and the charge storage film are not less than 0.5 monolayer but are less than 1.0 monolayer; a second insulating film formed on the charge storage film; and a control electrode formed on the second insulating film.

First Embodiment

A nonvolatile semiconductor memory device of this embodiment includes: a semiconductor layer; a first insulating film formed on the semiconductor layer; a charge storage film that is formed on the first insulating film and includes fullerenes; a second insulating film formed on the charge storage film; and a control electrode formed on the second insulating film.

If the fullerenes are C60 fullerenes, the charge storage film is not less than 0.5 monolayer but is less than 1.0 monolayer. If the fullerenes are C70 fullerenes, the charge storage film is not less than 0.3 monolayer and not more than 0.5 monolayer.

In the following, a monomolecular layer means a layer that is formed with one-molecule layer in a plane. That is, a monomolecular layer has a film thickness equivalent to one molecule.

"Monolayer (ML)" is the name of a unit that indicates how many molecules exist in an actual monomolecular layer, or the coverage rate, with respect to 1 monolayer that is the number of molecules in an ideal or defect-free monomolecular layer. For example, 0.5 monolayer is written as 0.5 ML in a graph or the like, and means that molecules exist at a coverage rate of 50% with respect to an ideal or defect-free monomolecular layer.

In this specification, a film of 1 monolayer or less invariably means a monomolecular layer. A film that is more than 1 monolayer is a multiple layer formed by stacking monomolecular layers. In a film of 1.5 monolayers, for example, a molecular layer of 0.5 monolayer exists on a molecular layer of 1 monolayer. The lower layer of 1 monolayer in this case is not necessarily ideal or defect-free, and it is rare that an actual molecular layer is completely defect-free.

The nonvolatile semiconductor memory device of this embodiment has the above described structure, and accordingly can have a thinner charge storage film while maintaining or improving charge storage properties. Thus, a scaled down nonvolatile semiconductor memory device can be realized.

Figure 1:
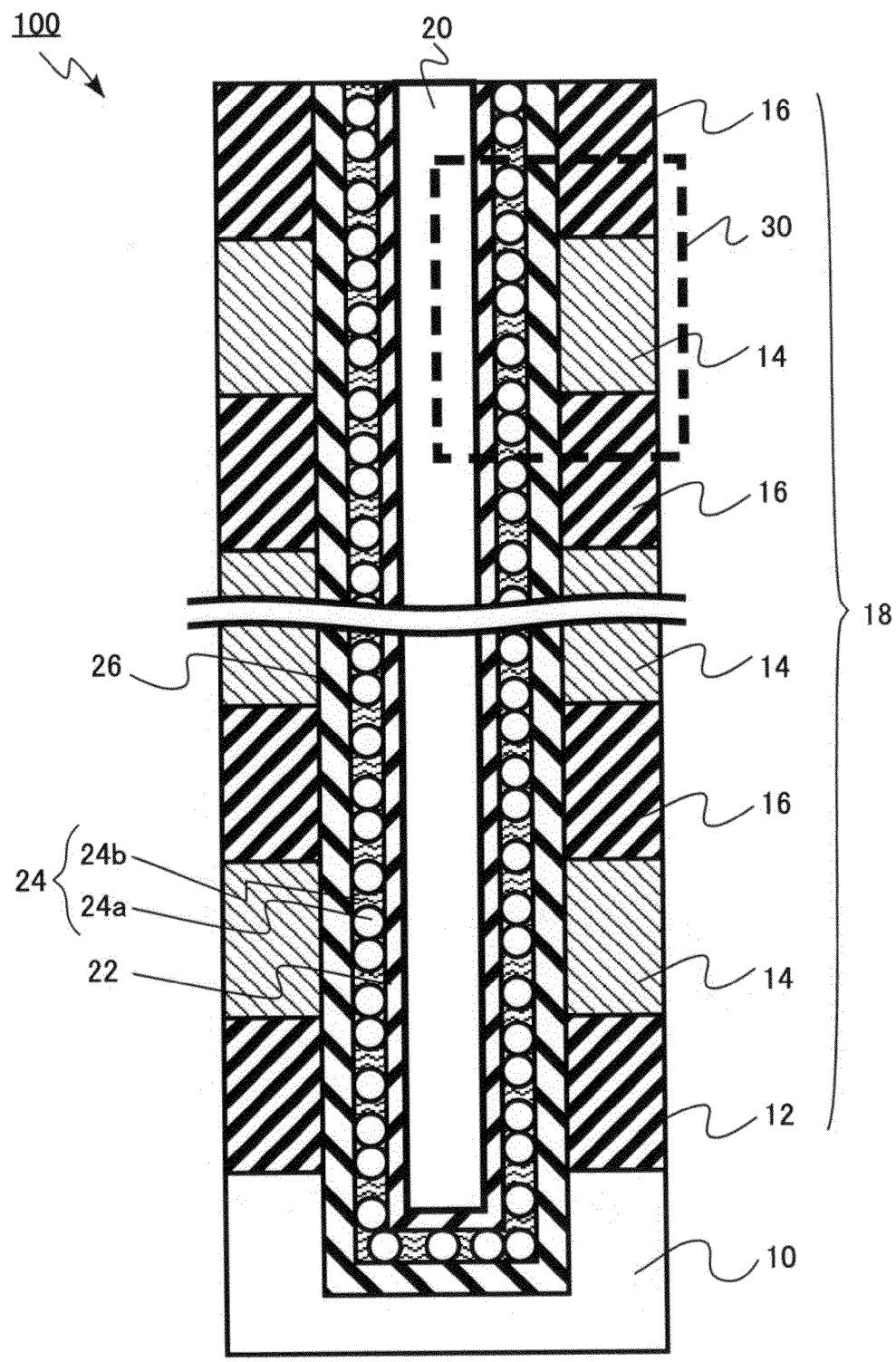
FIG. 1 is a schematic cross-sectional view of a nonvolatile semiconductor memory device according to a first embodiment.

FIG. 1 is a schematic cross-sectional view of the nonvolatile semiconductor memory device according to this embodiment. The nonvolatile semiconductor memory device 100 according to this embodiment is a three-dimensional device utilizing the so-called BiCS (Bit-Cost Scalable) technique.

In the nonvolatile semiconductor memory device 100, a substrate insulating film 12 is formed on a substrate 10, and control electrodes (gate electrodes) 14 and control interelectrode insulating films 16 are alternately stacked on the substrate insulating film 12. That is, a stack structure 18 formed by alternately stacking the substrate insulating films 12 and the control electrodes 14 is provided on the substrate 10.

In the direction in which the respective films of the stack structure 18 are stacked, a columnar semiconductor layer 20 is formed to extend from the upper surface of the stack structure 18 to the inside of the substrate 10. Between the columnar semiconductor layer 20 and the stack structure 18, a tunnel insulating film (a first insulating film) 22, a charge storage film 24, and a block insulating film (a second insulating film) 26 are formed in this order from the semiconductor layer 20.

In FIG. 1, the region surrounded by a dashed line is a memory cell 30. The memory cell 30 has a structure in which the tunnel insulating film (the first insulating film) 22 is formed on the semiconductor layer 20, the charge storage film 24 is formed on the tunnel insulating film (the first insulating film) 22, the block insulating film (the second insulating film) 26 is formed on the charge storage film 24, and a control electrode 14 is formed on the block insulating film (the second insulating film) 26.

Here, the charge storage film 24 has a function to actively store charges as memory cell information. When writing or erasing is performed on the memory cell, the tunnel insulating film (the first insulating film) 22 functions as an electron/hole transfer pathway between the channel region in the semiconductor layer 20 and the charge storage film 24 through a tunneling phenomenon. At the time of reading or standing by, the tunnel insulating film 22 has a function to restrain electron/hole transfers between the channel region and the charge storage film 24 by its barrier height. The block insulating film (the second insulating film) 26 is a so-called interelectrode insulating film, and has a function to block the electron/hole flow between the charge storage film 24 and the control electrode 14.

A control interelectrode insulating film 16 is formed between the two control electrodes 14 of each of the two adjacent memory cells 30. The insulation properties between the control electrodes 14 are secured by the control interelectrode insulating films 16.

The substrate 10 is preferably a semiconductor substrate of single-crystal silicon (Si) having the (100) plane exposed. Other than that, the substrate 10 may be a single-crystal silicon substrate having some other plane orientation, a polycrystalline silicon substrate, a single-crystal germanium (Ge) substrate, a SiGe epitaxial substrate epitaxially grown on a silicon substrate, an InP substrate, a GaAs substrate, or the like. Further, the substrate 10 may be a glass substrate, an aluminum substrate, a stainless substrate, an organic substrate, some other insulator substrate, some other metal substrate, some other crystalline substrate, or the like.

In a case where an insulator substrate is used, for example, a semiconductor film may be formed in contact with or not in contact with the insulator substrate. In a case where a metallic substrate having electrical conduction properties is used, for example, an insulating film may be formed on the metallic substrate, and a semiconductor film may be further formed on the insulating film. Here, the insulating film may be in contact with or not in contact with the metallic substrate, and the semiconductor film may be in contact with or not in contact with the insulating film. A TFT (Thin Film Transistor) or the like can be formed by using the semiconductor film, to form a semiconductor circuit.

The substrate insulating film 12 may be an insulating film such as a $SiO_2$ film, a SiN film, a SiON film, an $Al_2O_3$ film, a HfAlO film, a HfSiO film, or a HfSiON film. If the substrate 10 is an insulator substrate, for example, the substrate insulating film 12 can be omitted.

The columnar semiconductor layer 20 may be made of polycrystalline silicon, IGZO (InGaZnO), HIZO (HfInZnO), or InMgO, for example. Other than that, a semiconductor material such as a kind of semiconductor nanotube or a kind of semiconductor nanowire can be used as the semiconductor layer 20.

The tunnel insulating film 22 may be a $SiO_2$ film, a SiON film, a HfSiO film, or a parylene film, for example.

The charge storage film 24 is a film that includes fullerenes 24a. Matrix components 24b may exist between the fullerenes 24a.

In a case where the fullerenes 24a are C60 fullerenes, the charge storage film 24 is a monomolecular layer, and is not less than 0.5 monolayer but is less than 1.0 monolayer. In a case where the fullerenes 24a are C70 fullerenes, the charge storage film 24 is a monomolecular layer, and is not less than 0.3 monolayer and not more than 0.5 monolayer.

The charge storage film 24 is a monomolecular layer having only one layer of fullerene molecules. Therefore, the film thickness of the charge storage film 24 is very small, such as 1.0 nm, which is approximately the diameter of a C60 or C70 fullerene molecule.

As for the order structure of the fullerenes 24a in the charge storage film 24, the fullerenes 24a preferably have two molecules short-range order, and do not have long-range order.

In short-range order, the distances between atoms or molecules are short. More specifically, the nearest distance, the number of atoms or molecules, the bond distances between atoms or molecules, the bond angles between atoms or molecules, and the like show ordered values. Short-range order generally includes the second-neighbor or third-neighbor order, but the short-range order required in the device is only the shortest-range order. Second-neighbor or third-neighbor order may be used in this device, but result in degradation of characteristics. Therefore, second-neighbor or third-neighbor order should preferably not exist. The distances between atoms or molecules should not be equal to or longer than the half of the entire charge storage film 24 in the device. That is, the fullerenes 24a having two molecules short-range order in the charge storage film 24 means that pairs of fullerene molecules 24a are distributed at substantially regular intervals in the charge storage film 24. Three or four molecules of fullerenes 24a may exist at substantially regular intervals, but the intervals should not be equal to or longer than the half of the entire charge storage film 24 in the device.

Long-range order means that there are certain repetitive structures among atoms or molecules. Among crystals, for example, atoms or molecules are periodically arranged, and have long-range order. In long-range order, not all the atoms or molecules need to be periodically arranged, and even if there are a certain number of defects or less, the long-range order is maintained. The arrangement of atoms or molecules in a real space can be transformed into arrangement of atoms or molecules in a reciprocal lattice space by performing a Fourier transform on the space components in a differentiable coordinate system. In a case where there is long-range order, however, lattice points are characteristically obtained in such a reciprocal lattice space. In a case where there is only short-range order, on the other hand, lattice points in a reciprocal lattice space cannot be obtained by selecting any differentiable coordinate system.

The order structure of the fullerenes 24a in the charge storage film 24 can be identified by TEM (Transmission Electron Microscope) observation, for example. In doing so, a real-space image may be used, or TEM diffraction may be performed, for example. After a coordinate transform is performed on a real-space image, a Fourier transform may be performed, for example.

When charges are stored into the charge storage film 24, dimers of C60 fullerenes or C70 fullerenes are formed. As monomers of C60 fullerenes or C70 fullerenes dimerize, charges (electrons) are stored into the charge storage film 24.

The formation of dimers of the fullerenes 24a at the time of charge storing into the charge storage film 24 can be confirmed by detecting a dimer mode peak profile through Raman scattering, for example.

The characteristics of a charge storage film that includes fullerene molecules in a monomolecular layer were evaluated through an experiment in a planar structure, and the experiment results are described below in detail.

A structure formed with a silicon substrate, a tunnel insulating film that was a silicon oxide film, a charge storage film containing C60 or C70 fullerenes, a block insulating film made of alumina ($Al_2O_3$), and control electrodes (gate electrodes) made of gold (Au) was manufactured. The charge storage film had a structure that was continuous between the control electrodes. The write/erase characteristics of the charge storage film were evaluated.

Specifically, a 5-nm $SiO_2$ tunnel insulating film was formed on a silicon substrate by thermal oxidation in a vertical oxidation furnace.

C60 or C70 fullerenes were formed as the charge storage film on the tunnel insulating film by thermal deposition. As a deposition apparatus, an EDB-6DH deposition apparatus manufactured by Nihon Shinku Gijutsu Kabushiki Kaisha (current ULVAC, Inc.) was used, and the film formation was performed in a thermal deposition mode. The base vacuum was 4E-6 Pa. The distance from the substrate to the boat was 20 cm.

The substrate was not actively heated, but was slightly heated by radiation from a vapor deposition source. The heating current for the boat used in the vapor deposition was approximately 15 A, and the vapor deposition time was as short as about 1 minute. Therefore, it is considered that the substrate temperature was not lower than 20 degrees centigrade, which is room temperature, and not higher than 100 degrees centigrade. The substrate was provided in a top-down manner, so that dust and the like are avoided.

The C60 and C70 fullerene molecules were stacked, as the number of monolayers was varied by adjusting the amount of the raw material. In a case where the number of monolayers was smaller than 1, it was confirmed by TEM observation that the charge storage film was a monomolecular layer. It was also confirmed by TEM observation that the fullerene molecules had short-range order but did not have long-range order.

Matrix components were not formed, and a 15-nm alumina ($Al_2O_3$) film was formed as the block insulating film on the charge storage film. The $Al_2O_3$ film was formed by a sputtering technique. An apparatus of the MPS 8000 series manufactured by ULVAC, Inc. was used. The substrate temperature was not lower than 20 degrees centigrade and not higher than 35 degrees centigrade, and the film formation was performed on an Al target by a reactive sputtering technique.

A control electrode (gate electrode) pattern made of gold (Au) was formed on the $Al_2O_3$ block insulating film. After the oxide film was removed by a diluted hydrofluoric acid treatment, an aluminum (Al) electrode was formed on the back surface of the substrate.

Figure 2A:
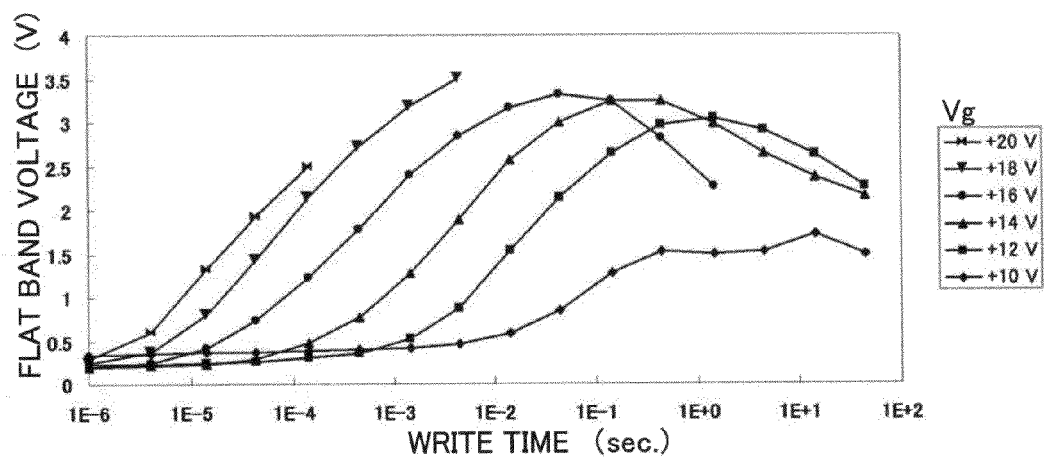
FIG. 2A is a graph showing the results of evaluations of write characteristics.
Figure 2B:
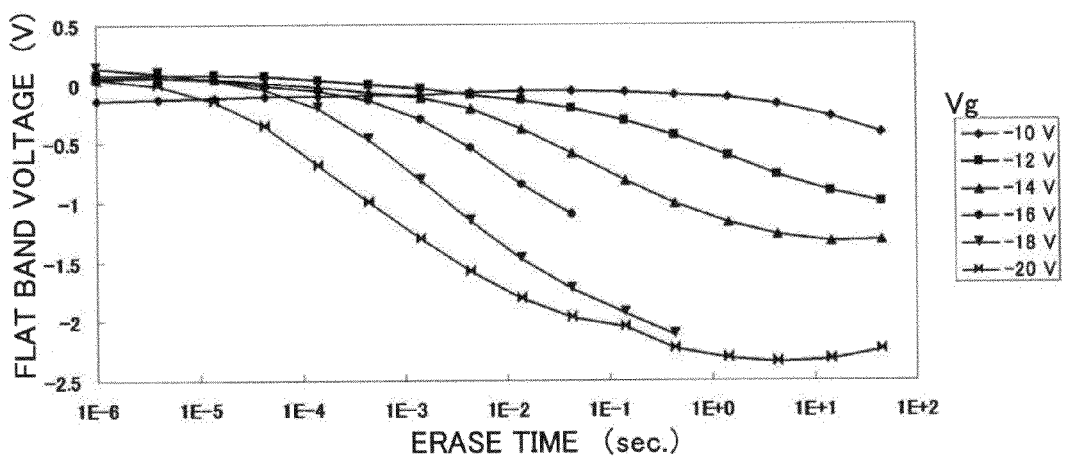
FIG. 2B is a graph showing the results of evaluations of erase characteristics.

FIGS. 2A and 2B are graphs showing the results of evaluations of write/erase characteristics. In the above described structure, a write or erase voltage pulse Vg was applied between the gate electrodes and the back surface of the substrate. The C-V (capacitance-voltage) characteristics between the gate electrodes and the substrate were then measured, to obtain the write/erase characteristics. FIG. 2A shows the write characteristics, and FIG. 2B shows the erase characteristics.

FIGS. 2A and 2B show the results obtained in the case of C70 of 0.6 monolayer. In each of the graphs, the abscissa axis indicates the length of the write or erase pulse, and the ordinate axis indicates the value of the flat band voltage in the C-V characteristics. The voltage Vg of the write or erase pulse was varied.

The apparatuses used in the measurement were an LCR meter manufactured by Agilent Technologies, Inc., a pulse generator, and a noise-proof prober. After the write or erase voltage pulse Vg was applied by the pulse generator, the C-V curve was measured with the LCR meter, to determine the flat band voltage. The variations in the flat band voltage shown in FIGS. 2A and 2B are the write/erase characteristics linked directly to the characteristics of the nonvolatile semiconductor memory device.

Figure 3:
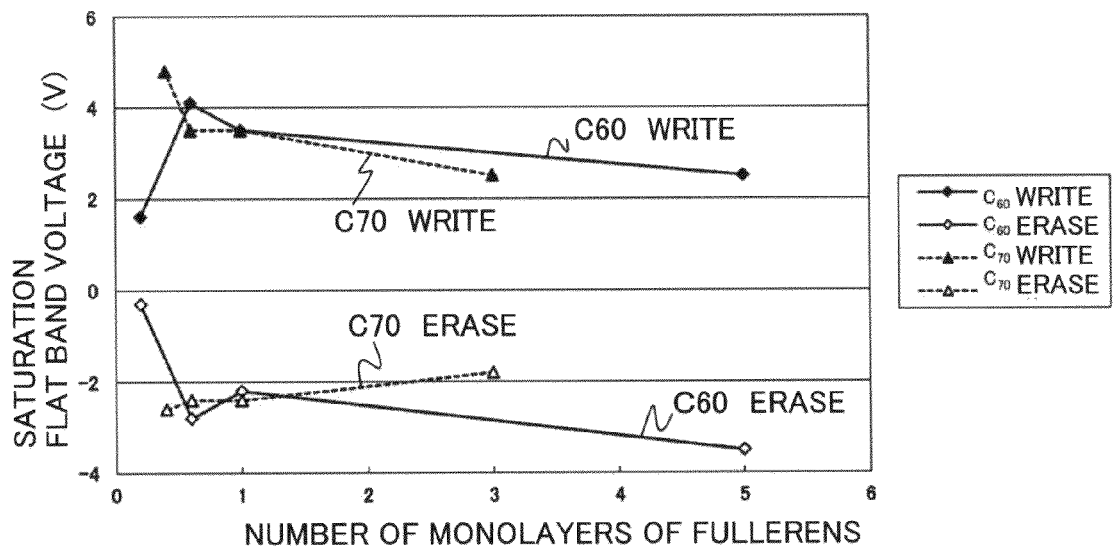
FIG. 3 is a graph showing the relationship between the number of monolayers of fullerenes and the saturation flat band voltage of write/erase.

As can be seen from FIGS. 2A and 2B, 3.5-V writing and −2.3-V erasing can be performed in the C70 of 0.6 monolayer. In the case of C60, the same write/erase characteristics as those shown in FIGS. 2A and 2B were obtained.

Figure 4:
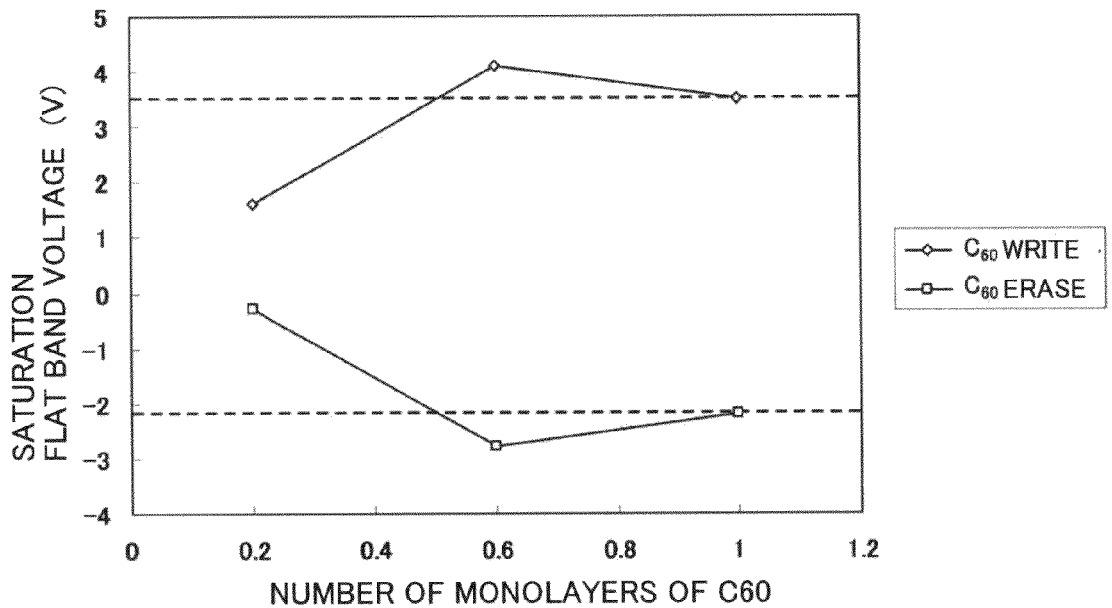
FIG. 4 is a graph showing the relationship between the number of monolayers of fullerenes and the saturation flat band voltage of write/erase.

FIGS. 3 and 4 are graphs showing the relationships between the number of monolayers of fullerenes and the saturation flat band voltage of writing/erasing. FIG. 3 shows the saturation flat band voltages obtained by evaluating write/erase characteristics of both C60 and C70. FIG. 4 is an enlarged view of the region where the number of monolayers is equal to or smaller than 1 monolayer in the C60 shown in FIG. 3.

In FIG. 3, the samples each having more than 1 monolayer are not monomolecular layers, but are multiple layers in which monomolecular layers are stacked in the thickness direction.

As is apparent from FIGS. 3 and 4, in the case of C60, the most preferable write/erase characteristics are realized when the number of monolayers is 0.6. Preferably, the number of monolayers is not smaller than 0.5 but is smaller than 1.0. More preferably, the number of monolayers is not smaller than 0.5 and not higher than 0.7. Within this range, monomolecular layers having small monolayers (ML) are formed, and excellent write/erase characteristics are achieved. Within this range, write/erase characteristics equivalent to those of a film of 1 or more monolayers are achieved.

As is apparent from FIG. 3, in the case of C70, the most preferable write/erase characteristics are realized when the number of monolayers is 0.4. Preferably, the number of monolayers is not smaller than 0.3 and not higher than 0.5. Within this range, monomolecular layers having small monolayers (ML) are formed, and excellent write/erase characteristics are achieved. Within this range, better write/erase characteristics than those of a film of 1 monolayers are achieved.

In cases where the number of monolayers is 1 or larger, the fullerene molecules are inevitably in a closest packed state. Therefore, it is considered that, as fullerene molecules turn into polymers through electron injection, fullerene nanowires are generated.

In this experiment, the charge storage film is not divided among the respective gate electrodes. Therefore, in cases where the number of monolayers is 1 or larger, it is considered that the fullerene nanowires spread into adjacent devices. That is, it is considered that, as the injected electrons spread in the in-plane direction, the charge storage properties are degraded.

CDW (charge density waves) are generated in the fullerene nanowires, and an energy gap is formed for electron transfers caused by the CDW pinned to the defects inside or near the fullerene nanowires. With this arrangement, even in a case where the number of monolayers is 1 or larger, not all the electrons leak out, and writing can be performed.

Accordingly, electron leakage in the transverse direction of the film can be more efficiently restrained in a charge storage film that is a monomolecular layer and includes fullerenes of less than 1 monolayer, than in a monomolecular layer of 1 monolayer or a film of thicker monolayers. Therefore, such a charge storage film is particularly suitable for a structure in which patterning is not performed to divide the charge storage film 24 among the memory cells as in the device of this embodiment illustrated in FIG. 1.

The fullerene molecules in the charge storage film 24 are not in a random or disordered or amorphous state, and do not have long-range order like crystals or surface crystals, but preferably have short-range order.

Short-range order is the order which is most prominent with nearest-neighbor molecules, but becomes disordered as the distance between the molecules becomes longer.

Short-range order is preferably established by forming dimers of fullerene molecules. Oligomers such as trimers or tetramers may be formed, and molecules or particles or clusters may be bonded to one another in a network fashion.

Figure 5A:
FIGS. 5A and 5B are diagrams showing electron distributions of fullerene molecules.
Figure 5B:
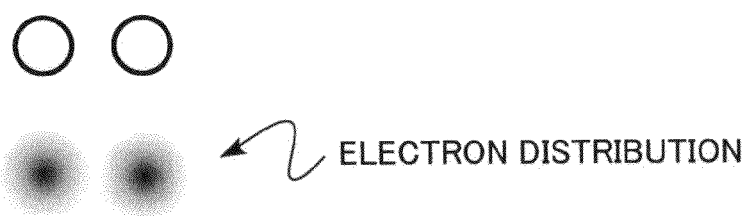

FIGS. 5A and 5B are diagrams showing electron distributions of fullerene molecules. FIG. 5A illustrates a case of a dimer, and FIG. 5B illustrates a case of monomers. A fullerene molecule can form a dimer with an adjacent fullerene molecule. The sp2 carbon atoms constituting a fullerene molecule are inherently forbidden to have a reaction to form sp3 covalent bonds due to orbital symmetry. However, as electrons are supplied, the orbital symmetry allows the dimer formations.

As shown in FIG. 5A, in such a dimer, the electron distribution is ellipsoidal, with the middle point between the two fullerene molecules being the center point, therefore the center of the electron distribution exists outside the frames of the fullerene molecules.

That is, the centers of the electron distributions exist in the respective fullerene molecules in the case of monomers as shown in FIG. 5B, but the center of the electron distribution exists outside the fullerene molecules in the case of a dimer. Therefore, a [2+2] cycloaddition reaction between two fullerene molecules forms a covalent bond in this embodiment, and one electron is stored.

With such a mechanism, a nonvolatile semiconductor memory device that excels in charge retention properties can be manufactured. Accordingly, even if the tunnel insulating film having the function of a stored charge barrier, the block insulating film, or the interlayer insulating films are made thinner, the charge retention properties are not easily degraded. Thus, a nonvolatile semiconductor memory device having thinner films used in the memory cells can be realized.

Figure 6A:
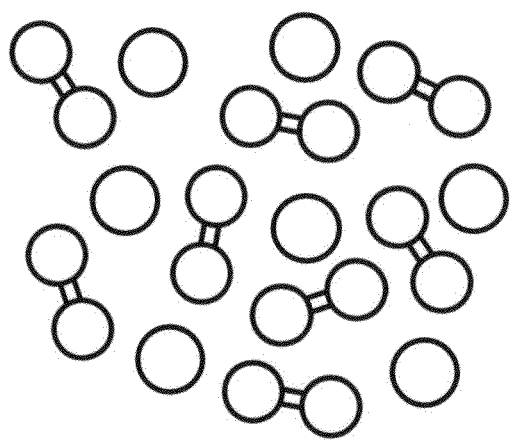
FIGS. 6A through 6C are diagrams for explaining the order structures of fullerene molecules.
Figure 6B:
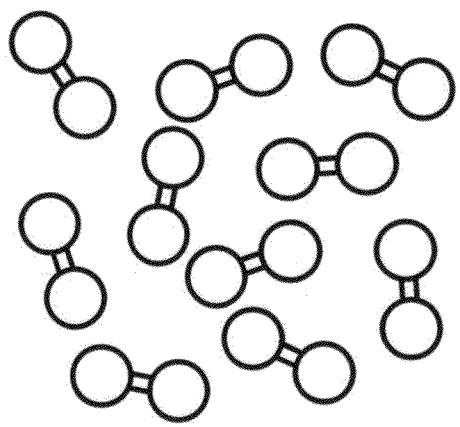
Figure 6C:
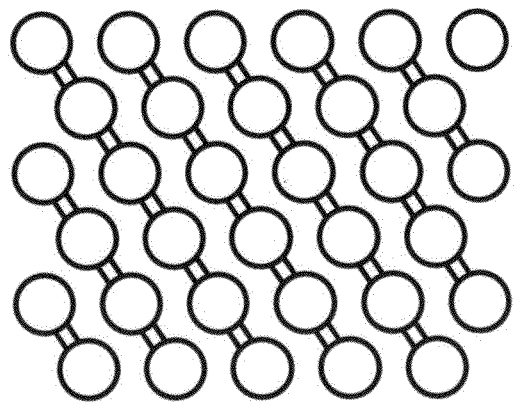

FIGS. 6A through 6C are diagrams for explaining the order structures of fullerene molecules. FIG. 6A illustrates a case where C60 has less than 1 monolayer. FIG. 6B illustrates a case where C70 has less than 1 monolayer. FIG. 6C illustrates a case where C60 or C70 has 1 monolayer.

In this embodiment, all monomers should not be integrated, and monomers should not have long-range order. Particularly, as shown in FIG. 6C, if fullerene molecules are linearly bonded to one another to form nanowires, the nanowires need to be prevented from protruding from the channel region or the gate electrode region. In the case of a closest packed structure, for example, if the structure has long-range order like a face-centered cubic structure, a hexagonal closest packed structure, a surface triangular lattice structure, or a surface kagome lattice, charges might leak out in the in-plane direction as described above.

Fullerene molecules store one electron in a dimer, as described above. Therefore, fullerene molecules preferably have two molecules short-range order, and do not have long-range order. With such an order structure, charge leakage from the film can be restrained, in spite of the charge storage amount becomes larger.

The charges stored by injection through the tunnel film in the above described experiment were equivalent to one electron per three C60 molecules. Therefore, it is considered that about two out of three C60 molecules dimerized as shown in FIG. 6A, and one electron was stored for each one dimer. About one out of three C60 molecules is considered to be an independent molecule that does not form a dimer.

In the case of C70, the charges stored by injection through the tunnel film were equivalent to one electron per two C70 molecules. Therefore, it is considered that almost all the C70 molecules dimerized as shown in FIG. 6B, and one electron was stored for each one dimer.

Figure 7:
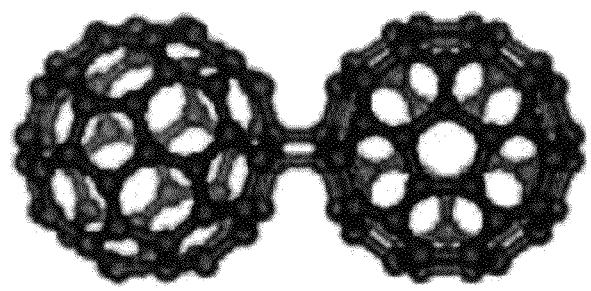
FIG. 7 is a schematic view of a dimer of C60 molecules.

FIG. 7 is a schematic view of a dimer of C60 molecules. In the case of a dimer of C60 fullerenes, the distance between the centers of C60 fullerene molecules is not shorter than 0.80 nm and not longer than 0.95 nm as shown in FIG. 7, and is shorter than 1.0 nm, which is the distance between the centers of fullerenes aggregated by a van der Waals' force. Also, the distance between the carbon frames is not shorter than 0.13 nm and not longer than 0.19 nm. The same applies to the case of C70.

This dimer formation by the fullerene molecules in the charge storage film 24 can occur not only in the cases of C60 and C70 fullerenes but also in the case of higher fullerenes. Particularly, in many cases where higher fullerenes are used, a phason line is formed due to conflict between sp2 bonds, which is advantageous for charge storage. Not all the carbon atoms in higher fullerenes exist on perfect spheres. Therefore, higher fullerene is subject to stop the thermal rotation at the low energy orientation by the influence of matrix components 24b. In such a situation, the rotations stop when the phason line exists on the side of the tunnel film. This is particularly advantageous for charge storage.

The matrix components 24b are not necessarily required as described above, but can be made of one material or a mixture of some materials or a combination of some materials selected from the following materials: Si, Ge, SiGe, Au, Ag, Cu, Ru, Pt, Hf, Zr, Ti, Al, Mg, TiO, RuO, TiN, HfN, $SiO_2$, SiON, $Al_2O_3$, MgO, $CaF_2$, $La_2O_3$, $HfO_2$, HfAlO, HfSiON, TiO, and the like. The matrix components 24b may be insulators or semiconductors.

The block insulating film (the second insulating film) 26 can be made of one material or a mixture of some materials or a combination of some materials selected from the following materials: $SiO_2$, SiN, $Al_2O_3$, MgO, $CaF_2$, $La_2O_3$, and $HfO_2$, for example.

Highly-doped polycrystalline silicon can be used for the control electrodes 14, for example. Some other material may be used for the control electrodes 14, as long as the material excels in electrical conduction properties. For example, it is possible use a material such as Ta, TaC, TaN, TaB, Ta(O, C, N), W, WC, WN, WB, W(O, C, N), Hf, HfC, HfN, HfB, Hf(O, C, N), Re, ReC, ReN, ReO, ReB, Re(O, C, N), Nb, NbC, NbN, NbB, Nb(O, C, N), Mo, MoC, MoN, MoB, Mo(O, C, N), Zr, ZrC, ZrN, ZrB, Zr(O, C, N), Ti, TiC, TiN, TiB, or Ti(O, C, N). Also, the control electrodes 14 preferably excel in heat resistance. The control electrodes 14 preferably adjust a work function to an appropriate value. Specifically, Ta or a Ta compound can be used.

The control interelectrode insulating films 16 may be insulating films such as $SiO_2$ films, SiN films, SiON films, $Al_2O_3$ films, HfAlO films, HfSiO films, or HfSiON films.

Next, the operating principles of the nonvolatile semiconductor memory device 100 according to this embodiment are described.

In a case where information is stored into the nonvolatile semiconductor memory device 100, a predetermined voltage is applied to the control electrodes 14 of the memory cells 30 constituting the nonvolatile semiconductor memory device 100. At this point, charges from the semiconductor layer 20 are stored into the charge storage film 24 via the tunnel insulating film (the first insulating film) 22. By storing charges into the charge storage film 24 in this manner, information is stored into the nonvolatile semiconductor memory device 100.

In the nonvolatile semiconductor memory device 100 according to this embodiment, charges are stored, with the centers of the charge distributions being at the covalent-bonding portions of the two fullerene molecules 24a contained in the charge storage film 24. Since not all the fullerene molecules 24a contained in the charge storage film 24 are bonded to one another, charge transfers among the fullerene molecules 24a are restricted. The molecular arrangement is not in a crystalline or random state, but is preferably in short-range order.

Specifically, dimers are the most preferable, and oligomers such as trimers or tetramers can also be used. Monomers may also exist therein. Dimers are the most preferable, because the number of electron charges that can be stored is considered to be 1 even in a trimer or a higher multimer or polymer. If the number of monolayers or fullerene molecules is the same, the stored charge amount can be maximized by storing charges in dimers.

Next, a method of manufacturing the nonvolatile semiconductor memory device 100 according to this embodiment is described. FIGS. 8 through 11 are schematic cross-sectional views illustrating the process of manufacturing the nonvolatile semiconductor memory device 100 of this embodiment.

First, the substrate insulating film 12 is formed on the semiconductor substrate 10. In a case where a silicon substrate having a (100) plane orientation is used as the semiconductor substrate 10, for example, $SiO_2$ is formed by thermally oxidizing the substrate 10 according to a thermal oxidation technique. The substrate insulating film 12 can also be formed by using CVD (Chemical Vapor Deposition) or a sputtering technique.

A control electrode 14 is then formed on the substrate insulating film 12. The control electrode 14 is formed by using CVD or a sputtering technique, for example.

A control interelectrode insulating film 16 is then formed on the control electrode 14. The control interelectrode insulating film 16 is formed by using CVD, a sputtering technique, or MBE (Molecular Beam Epitaxy), for example. The above procedures are repeated, to stack control electrodes 14 and control interelectrode insulating films 16 on the control interelectrode insulating film 16, and form the stack structure 18.

Figure 8:
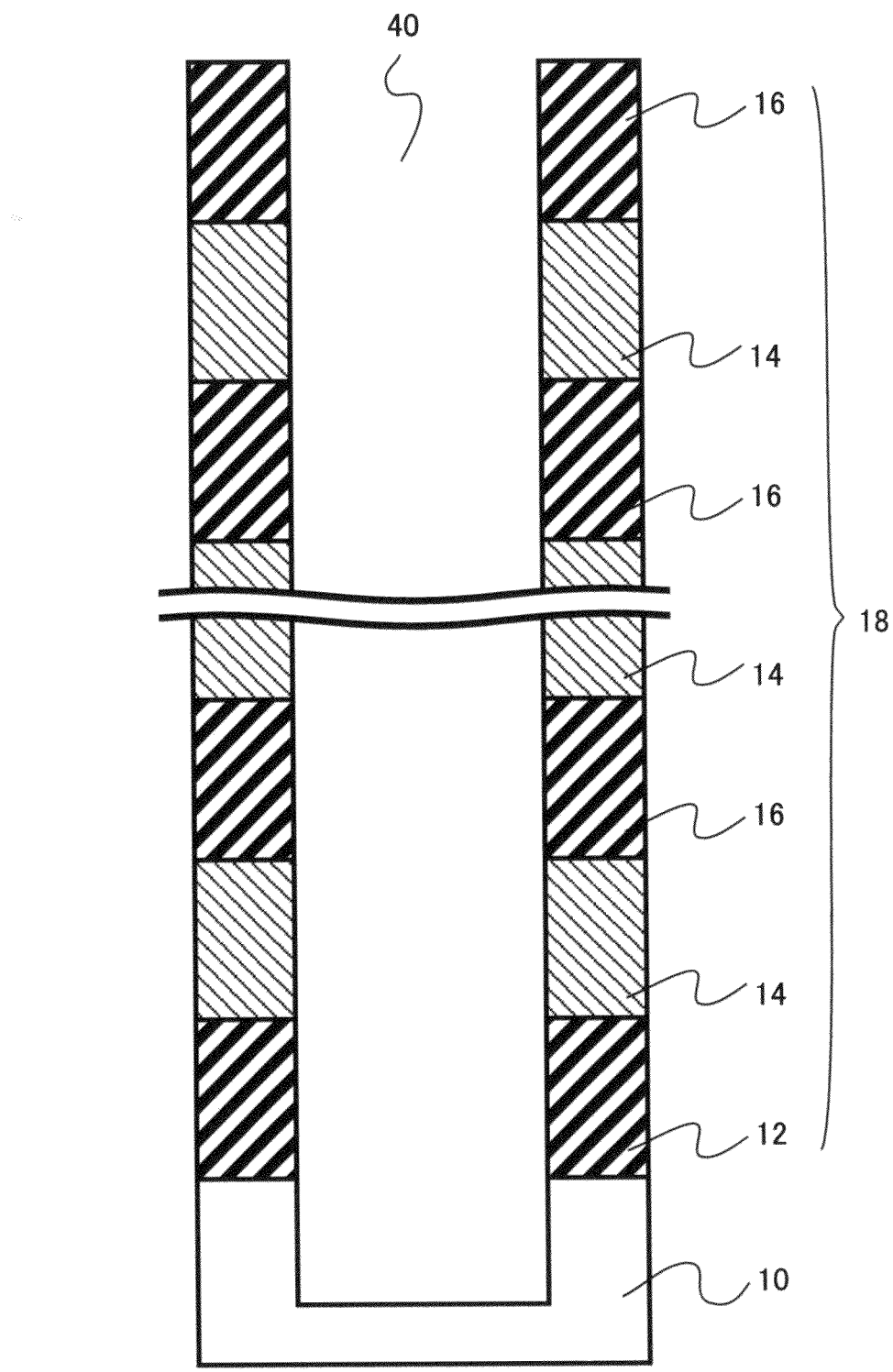
FIG. 8 is a schematic cross-sectional view illustrating a process of manufacturing the nonvolatile semiconductor memory device according to the first embodiment.

A hole 40 is then formed in the stacking direction of the films formed on the semiconductor substrate 10 (FIG. 8).

The hole 40 is formed to extend from the uppermost control interelectrode insulating film 16 to the semiconductor substrate 10, the substrate insulating film 12, the lowermost control electrode 14, or the lowermost control interelectrode insulating film 16 by using a lithography technique, an etching technique, or the like.

The hole 40 may be formed through several stages. For example, after four layers of control electrodes 14 and control interelectrode insulating films 16 are stacked, a hole 40 is formed. Four more layers of control electrodes 14 and control interelectrode insulating films 16 are then stacked, and a hole 40 is formed to overlap the previously formed hole 40. Each of the number of stacked control electrodes 14 and the number of stacked control interelectrode insulating films 16 is four in the above description. However, the number of stacked control electrodes 14, the number of stacked control interelectrode insulating films 16, and the number of times the hole 40 is formed may be changed where necessary.

Figure 9:
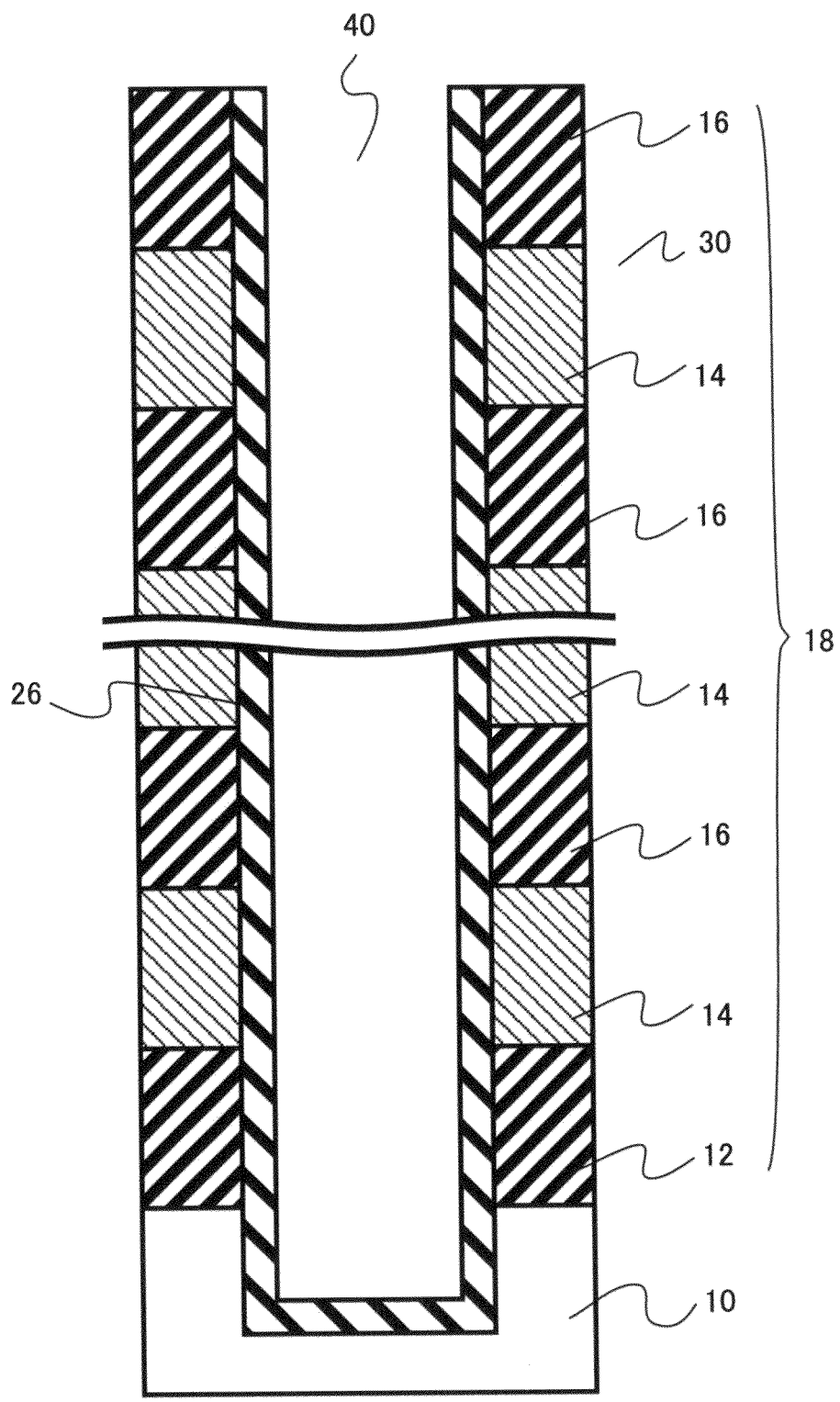
FIG. 9 is a schematic cross-sectional view illustrating the process of manufacturing the nonvolatile semiconductor memory device according to the first embodiment.

The block insulating film (the second insulating film) 26 is then formed along the inner surface of the hole 40. The block insulating film 26 is formed by using CVD, for example. At this point, the block insulating film 26 is formed in such a manner that the hole 40 remains. Alternatively, the block insulating film 26 may be formed by using a sputtering technique. In this case, a zero-high-gas-pressure atmosphere near the transition region from the glow region to the arc region is used, for example (FIG. 9).

Figure 10:
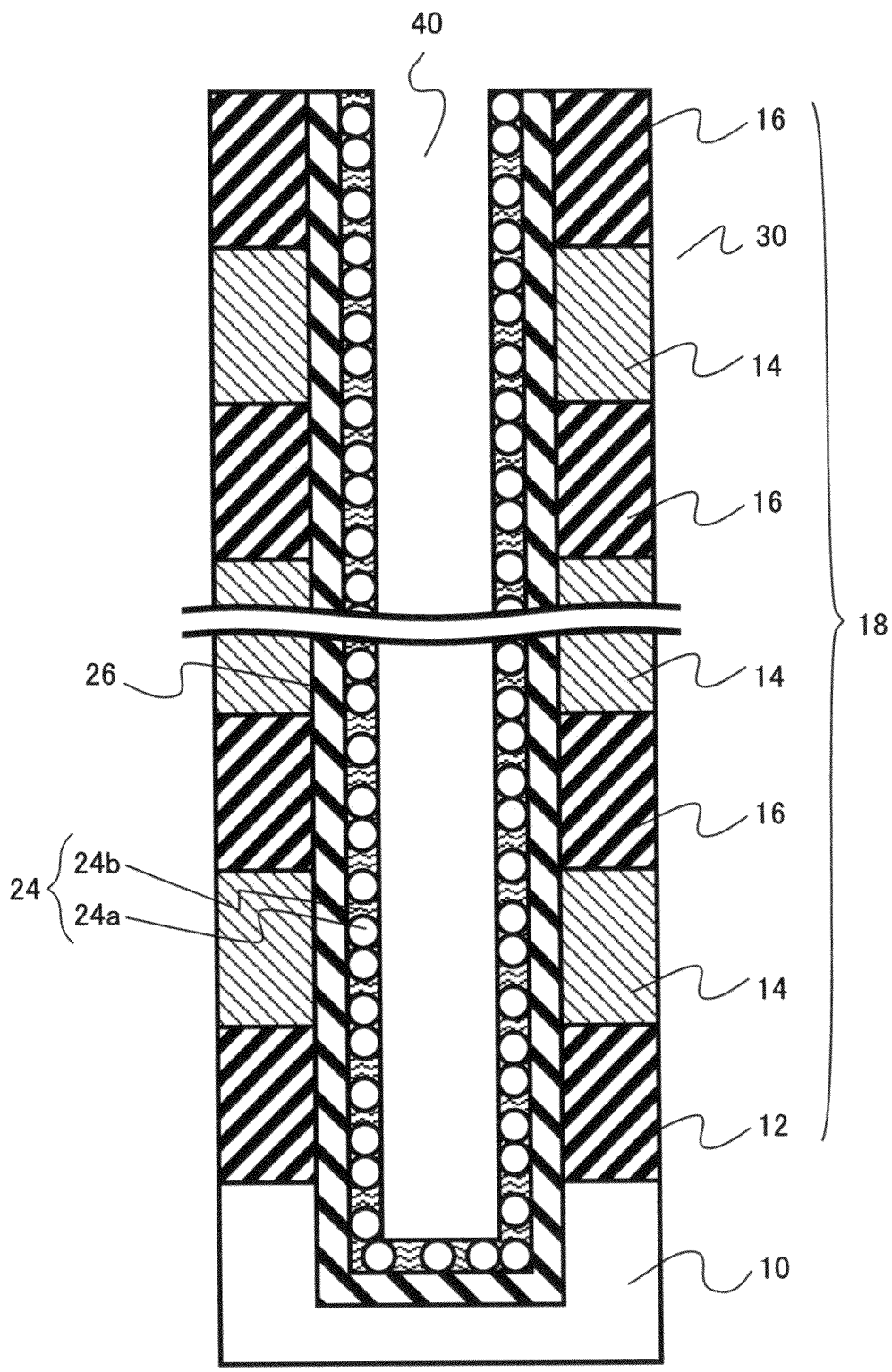
FIG. 10 is a schematic cross-sectional view illustrating the process of manufacturing the nonvolatile semiconductor memory device according to the first embodiment.

The charge storage film 24 is then formed on the surface of the block insulating film 26 formed inside the hole 40 (FIG. 10).

According to a first formation method, the matrix components 24b are formed with one material or a mixture of some materials or a combination of some materials selected from the following materials: $SiO_2$, SiON, $Al_2O_3$, MgO, $CaF_2$, $La_2O_3$, $HfO_2$, HfAlO, HfSiON, Si, Ge, TiO, and the like. After that, the fullerenes 24a are formed, and matrix components 24b are again formed with one material or a mixture of some materials or a combination of some materials selected from the following materials: $SiO_2$, SiON, $Al_2O_3$, MgO, $CaF_2$, $La_2O_3$, $HfO_2$, HfAlO, HfSiON, Si, Ge, TiO, and the like. At this point, the matrix components 24b first formed may have a different composition from that of the matrix components 24b formed later.

According to a second formation method, the matrix components 24b are formed with one material or a combination of some materials selected from the following materials: SiO, SiON, $Al_2O_3$, MgO, $CaF_2$, $La_2O_3$, $HfO_2$, HfAlO, HfSiON, Si, Ge, TiO, and the like. After that, the fullerenes 24a are formed, and no matrix components 24b are again formed.

According to a third formation method, the fullerenes 24a are formed prior to the formation of the matrix components 24b. The matrix components 24b are then formed with one of the following materials: $SiO_2$, SiON, $Al_2O_3$, MgO, $CaF_2$, $La_2O_3$, $HfO_2$, HfAlO, HfSiON, Si, Ge, and TiO, for example.

According to a fourth formation method, the matrix components 24b are not formed at all, and the fullerenes 24a are formed.

The charge storage film 24 is formed by using ALD (Atomic Layer Deposition), for example. The charge storage film 24 can be formed by using any of various film forming methods falling into the category of CVD, such as hot-wall thermal CVD, APCVD (Atmospheric Pressure CVD), LPCVD (Low-Pressure CVD), UHVCVD (UltraHigh Vacuum CVD), AACVD (Aerosol Assisted CVD), DLICVD (Direct Liquid Injection CVD), MPCVD (Microwave Plasma-Assisted CVD), PECVD (Plasma-Enhanced CVD), RPECVD (Remote Plasma-Enhanced CVD), ALCVD (Atomic Layer CVD), HWCVD (Hot Wire CVD), Cat-CVD (Catalytic CVD), HFCVD (Hot Filament CVD), MOCVD (Metalorganic Chemical Vapor Deposition), HPCVD (Hybrid Physical-Chemical Vapor Deposition), RTCVD (Rapid Thermal CVD), VPE (Vapor Phase Epitaxy), thermal CVD, PECVD (Plasma Enhanced CVD), HDPCVD (High Density Plasma Chemical Vapor Deposition), MCVD (Modified Chemical Vapor Deposition), DCVD (Digital Chemical Vapor Deposition), SACVD (Sub-Atmospheric CVD), ECD (Electro Chemical Deposition), ALD (Atomic Layer Deposition), and AVD (Atomic Vapor Deposition).

In the formation of the fullerenes 24a, fullerenes may be used as the raw material, but it is preferable to use a raw material formed by modifying fullerenes. By performing appropriate modification, the boiling point of the modified fullerene molecules becomes lower, and a sufficiently high vapor pressure can be achieved at a relatively low temperature. Accordingly, the film formation can be performed by a method falling into the above described categories of ALD and CVD. By performing the film formation by a method falling into the categories of ALD and CVD after the molecules are modified, such film forming conditions as to form a relatively uniform film inside the hole 40 can be easily achieved.

The fullerenes are not necessarily modified, and may be included in cyclodextrins, crown ethers, calixarenes, porphyrins, or the like. By selecting an appropriate inclusion compound and lowering the boiling point, a sufficiently high vapor pressure can be achieved at a relatively low temperature. Accordingly, the film formation can be performed by a method falling into the above described categories of ALD and CVD.

Alternatively, the fullerenes 24a can be formed by a thermal vapor deposition technique, for example.

The matrix components 24b in the charge storage film 24 are also preferably formed by a method falling into the category of ALD or CVD. In a case where matrix components 24b made of a material containing Si, such as $SiO_2$, SiON, HfSiO, or HfSiON are formed, the molecules containing Si atoms may be at least one material selected from the following materials: monosilane, disilane, phenyl groups, diethoxymethylsilane, dimethylmethoxysilane, dimethyldiethoxysilane, methyltrimethoxysilane, methyltriethoxysilane, hexamethyldisiloxane, octamethylcyclotetrasiloxane, 1,1,1,3,3,5,5,5-octamethyltrisiloxane, N,N,N',N',N'',N''-hexamethylsilanetriazine, tetraisocyanatesilane, dimethyldimethoxysilane, tetramethylsilane, trimethylsilane, dimethylsilane, methylsilane, 1,1,3,3-tetramethyl-1,3-disiloxane, trimethoxysilane, trimethylvinylsilane, 1,3,5,7-tetramethylcyclotetrasiloxane, 1,1,1,3,3,3-hexamethyldisilazane, and tetraethoxysilane. Among those materials, it is particularly preferable to use at least one material selected from the following materials: trisdimethylaminosilane (TDMAS), tetraethoxysilane (TEOS), 1,1,1,3,3,3-hexamethyldisilazane (HMDS), isopropylaminosilane, and diisopropylaminosilane.

In a case where matrix components 24b made of a material containing Hf, such as HfO, HfSiO, or HfSiON, the molecules containing hafnium atoms may be at least one material selected from the following materials: alkylhafnium compounds such as tetramethylhafnium, tetraethylhafnium, tetrapropylhafnium, tetraisopropylhafnium, tetrabutylhafnium, tetraisobutylhafnium, tetra-sec-butylhafnium, and tetra-tert-butylhafnium; organic acid hafnium or organic acid hafnyl compounds such as hafnium formate, hafnium acetate, hafnium propionate, hafnium butyrate, hafnium isobutyrate, hafnium valerate, hafnium caproate, hafnium caprylate, hafnium 2-ethylhexanoate, hafnium caprate, hafnium neodecanoate, hafnium rosinate, hafnium naphthenate, hafnyl formate, hafnyl acetate, hafnyl propionate, hafnyl butyrate, hafnyl isobutyrate, hafnyl valerate, hafnyl caproate, hafnyl caprylate, hafnyl 2-ethylhexanoate, hafnyl caprate, hafnyl neodecanoate, hafnyl rosinate, and hafnyl naphthenate; alcoxyhafnium compounds such as tetrakis(methoxy)hafnium, tetrakis(ethoxy)hafnium, tetrakis(propoxy)hafnium, tetrakis(isopropoxy)hafnium, tetrakis(butoxy)hafnium, tetrakis(isobutyloxy)hafnium, tetrakis(sec-butyloxy)hafnium, tetrakis(tert-butyloxy)hafnium, tetrakis(amyloxy)hafnium, tetrakis(tert-amyloxy)hafnium, tetrakis[2-(2-methoxy)ethoxy]hafnium, tetrakis[2-(1-methyl-2-methoxy)propoxy]hafnium, tetrakis[2-(2-methoxy)propoxy]hafnium, tetrakis[2-(dimethylamino)ethoxy]hafnium, tetrakis[2-(2-dimethylamino-1-methyl)propoxy]hafnium, tetrakis[2-(2-dimethylamino)propoxy]hafnium, bis(2-propoxy)bis[2-(2-dimethylamino-1-methyl)propoxy]hafnium, bis(tert-butoxy)bis[2-(2-dimethylamino-1-methyl)propoxy]hafnium, bis(tert-butoxy)bis[2-(2-dimethylamino)propoxy]hafnium, (tert-butoxy)tris[2-(2-dimethylamino-1-methyl)propoxy]hafnium, tris(tert-butoxy)[2-(2-dimethylamino-1-methyl)propoxy]hafnium; aminohafnium compounds such as tetrakis(dimethylamino)hafnium, tetrakis(diethylamino)hafnium, tetrakis(ethylmethylamino)hafnium, tetrakis(dipropyl)hafnium, tetrakis(dibutylamino)hafnium, bis(dimethylamino)bis(diethylamino)hafnium, bis(diethylamino)bis(ethylmethylamino)hafnium, and (diethylamino)tris(ethylmethylamino)hafnium; aminohafnium compounds such as bis(methoxy)bis(dimethylamino)hafnium, bis(methoxy)bis(diethylamino)hafnium, bis(methoxy)bis(ethylmethylamino)hafnium, bis(ethoxy)bis(dimethylamino)hafnium, bis(ethoxy)bis(diethylamino)hafnium, bis(ethoxy)bis(ethylmethylamino)hafnium, bis(2-propoxy)bis(diethylamino)hafnium, bis(tert-butyl)bis(diethylamino)hafnium, bis(tert-butyl)bis(ethylmethylamino)hafnium, and (tert-butyl)tris(ethylmethyl)hafnium; hafnium β-diketonate compounds such as: alkyl-substituted β-diketonates such as tetrakisacetylacetonate, tetrakishexane-2,4-dionate, tetrakis-5-methylhexane-2,4-dionate, tetrakisheptane-2,4-dionate, tetrakis-2-methylheptane-3,5-dionate, tetrakis-5-methylheptane-2,4-dionate, tetrakis-6-methylheptane-2,4-dionate, tetrakis-2,2-dimethylheptane-3,5-dionate, tetrakis-2,6-dimethylheptane-3,5-dionate, tetrakis-2,2,6-trimethylheptane-3,5-dionate, tetrakis-2,2,6,6-tetramethylheptane-3,5-dionate, tetrakis-octane-2,4-dionate, tetrakis-2,2,6-trimethyloctane-3,5-dionate, tetrakis-2,6-dimethyloctane-3,5-dionate, tetrakis-2-methyl-6-ethyldecane-3,5-dionate, and tetrakis-2,2-dimethyl-6-ethyldecane-3,5-dionate; fluorine-substituted alkyl β-diketonates such as tetrakis-1,1,1-trifluoropentane-2,4-dionate, tetrakis-1,1,1-trifluoro-5,5-dimethylhexane-2,4-dionate, tetrakis-1,1,1,5,5,5-hexafluoropentane-2,4-dionate, and tetrakis-1,3-diperfluorohexylpropane-1,3-dionate; and ether-substituted β-dikenates such as tetrakis-1,1,5,5-tetramethyl-1-methoxyhexane-2,4-dionate, tetrakis-2,2,6,6-tetramethyl-1-methoxyheptane-3,5-dionate, and tetrakis-2,2,6,6-tetramethyl-1-(2-methoxyethoxy)heptane-3,5-dionate; cyclopentadienyl hafnium compounds such as tetrakis cyclopentadienyl hafnium, tetrakis(methylcyclopentadienyl)hafnium, tetrakis(ethylcyclopentadienyl)hafnium, and tetrakis(pentamethylcyclopentadienyl)hafnium; alkylhafnium compounds; organic acid hafnium compounds; alkoxyhafnium compounds; aminohafnium compounds; hafnium β-diketonate compounds; cyclopentadienyl compounds; hafnium halides such as hafnium tetrachloride; hafnyl chlorides; and hafnium β-diketonate compounds. Among those materials, it is particularly preferable to use at least one material selected from the following materials: hafnium chlorides, tetrakisdimethylaminohafnium (TDMAH), and tetrakisethylmethylaminohafnium (TEMAH). Those materials can be easily vaporized. By introducing those vaporized molecules into a portion near the substrate, a film containing hafnium atoms can be formed.

Molecules containing oxygen atoms may be $O_2$, NO, $NO_2$, $N_2O$, $O_3$, CO, $CO_2$, $H_2O_2$, alcohols, or the like. Among the above materials, it is preferable to use a mixture of some of $O_2$, $O_3$, $H_2O_2$, and alcohols. Other than that, there are cases where it is possible to use molecules containing La, molecules containing Ti, molecules containing Ge, molecules having Si or Hf substituted by La, Ti, Ge, or the like. Also, other chelate molecules can be used.

The methods of manufacturing the tunnel film, the charge storage film, and the block insulating film in the manufacture of the nonvolatile semiconductor memory device of this embodiment preferably fall into the category of CVD. This is because, by such methods, it is easy to form an insulating film that evenly covers the inside of the hole 40.

Further, the charge storage film 24 may be modified by performing a heat treatment after the formation of the charge storage film 24. The heat treatment may be performed prior to or after the film formation of the fullerenes 24a, or prior to or after the film formation of the matrix components 24b. The heat treatment may be performed several times prior to and after the film formation, or may not be performed at all.

The charge storage film 24 is modified for the following four reasons. The first reason is to remove impurities and the like contained in the charge storage film 24. The second reason is to add desired components to the charge storage film 24. The third reason is to change the composition distribution of the charge storage film 24. The fourth reason is to change the crystalline state in the charge storage film 24.

Other than the heat treatment, a technique using plasma, a technique involving ion or particle collisions, a technique using a highly-reactive gas such as ozone, or a technique involving collisions of particles having higher internal energy than the ground state such as radicals can be used to modify the charge storage film 24. Those techniques can also be combined to modify the charge storage film 24.

The process of performing a modifying operation such as a heat treatment on the charge storage film 24 may be carried out during or after the formation of the charge storage film 24, or after the formation of the nonvolatile semiconductor memory device 100.

Figure 11:
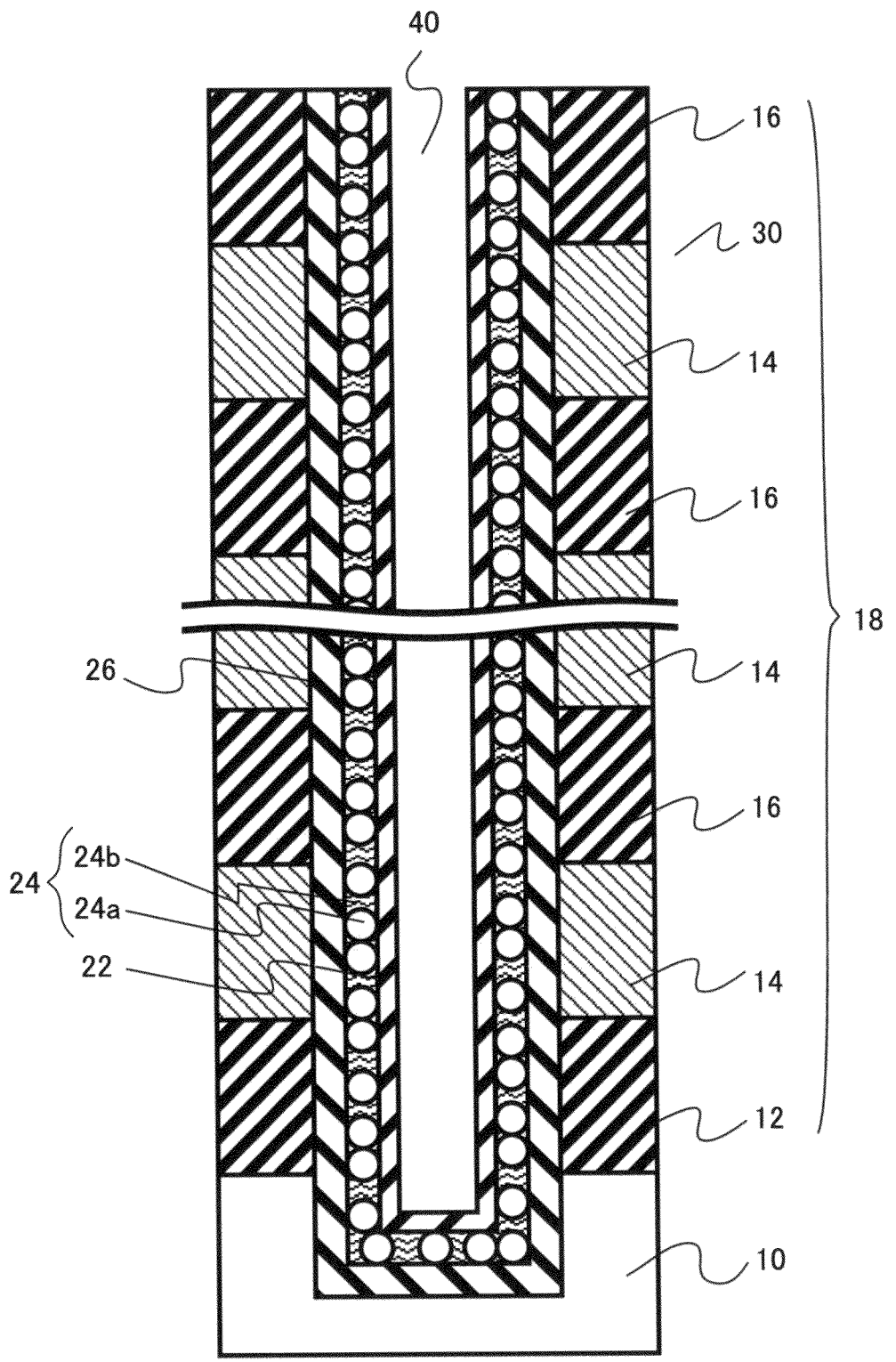
FIG. 11 is a schematic cross-sectional view illustrating the process of manufacturing the nonvolatile semiconductor memory device according to the first embodiment.

The tunnel insulating film (the first insulating film) 22 is then formed along the surfaces of the charge storage film 24 (FIG. 11). The tunnel insulating film 22 can be formed by using CVD or a film forming method falling into the category of CVD.

The semiconductor layer 20 is then formed along the surface of the tunnel insulating film 22. The semiconductor layer 20 is preferably formed to completely fill the hole 40. The semiconductor layer 20 is a polycrystalline silicon layer formed by CVD, for example.

The procedures to be carried out thereafter to manufacture the nonvolatile semiconductor memory device 100 are the same as those of a conventional art, and therefore, explanations of them are not described herein.

By the above described manufacturing method, the nonvolatile semiconductor memory device 100 of this embodiment is manufactured.

As described above, this embodiment can provide a nonvolatile semiconductor memory device that has a thinner charge storage film while maintaining high charge storage properties. Also, since such a nonvolatile semiconductor memory device has a three-dimensional structure, high integration can be realized.

C60 has the highest generation efficiency among fullerenes, and therefore, can be supplied at low costs. Accordingly, by using C60, the costs of nonvolatile semiconductor memory devices can be lowered. Also, by using C70, excellent write characteristics can be realized, as is apparent from FIG. 3.

In this embodiment, C60 and C70 fullerenes have been described. However, C76 fullerenes or higher, such as C76, C78, C82, C84, C90, or C96 fullerenes, can be used. Alternatively, endohedral fullerenes each including one or more other atoms or molecules, such as La@C82, can also be used.

Second Embodiment

A nonvolatile semiconductor memory device according to this embodiment differs from that of the first embodiment in having a three-dimensional structure that is not a three-dimensional structure utilizing the BiCS (Bit-Cost Scalable) technique. The film stack structure of each memory cell, including the charge storage film, is basically the same as that of the first embodiment. Therefore, the same explanations as those in the first embodiment will not be repeated.

The nonvolatile semiconductor memory device of this embodiment has a three-dimensional structure, such as P-BiCS (pipe-shaped bit-cost scalable), TCAT (terabit cell array transistor), VG (vertical gate)-NAND, VC (vertical channel)-NAND, cross-point-NAND, VSAT (vertical stacked array transistor), VRAT (vertical-recess-array-transistor), VG-TFT (vertical gate-thin film transistor)-NAND, DC-SF (dual control-gate with surrounding floating-gate), PNVG (PN diode decoded vertical gate), Hybrid 3D (hybrid stacked 3D), Si Pillar 3D NAND, stacked NAND, multi TFT S-SGT (stacked-surrounding gate transistor), VL-BiCS (vertical-gate ladder BiCS; VLB), STAR-NAND (single-crystalline Si stacked array NAND), stacked SONOS, VG-FG-NAND (vertical gate-floating gate-NAND), DSSB TFT (dopant segregated schottky barrier TFT), AAGSONOS (all-around-gate SONOS), or the like.

Since the charge storage film 24 is continuous between adjacent memory cells 30 in the first embodiment, the matrix components 24b of the charge storage film 24 need to be insulators or semiconductors. In many of the above described structures, however, the charge storage film 24 is not continuous between adjacent memory cells 30. In such cases, the matrix components 24b of the charge storage film 24 may be electrical conductors.

This embodiment can provide a nonvolatile semiconductor memory device that has a thinner charge storage film while maintaining high charge storage properties. Also, since such a nonvolatile semiconductor memory device has a three-dimensional structure, high integration can be realized.

Third Embodiment

A nonvolatile semiconductor memory device according to this embodiment differs from that of the first embodiment in having planar NAND memory cell structures. The film stack structure of each memory cell, including the charge storage film, is basically the same as that of the first embodiment. Therefore, the same explanations as those in the first embodiment will not be repeated.

Figure 12:
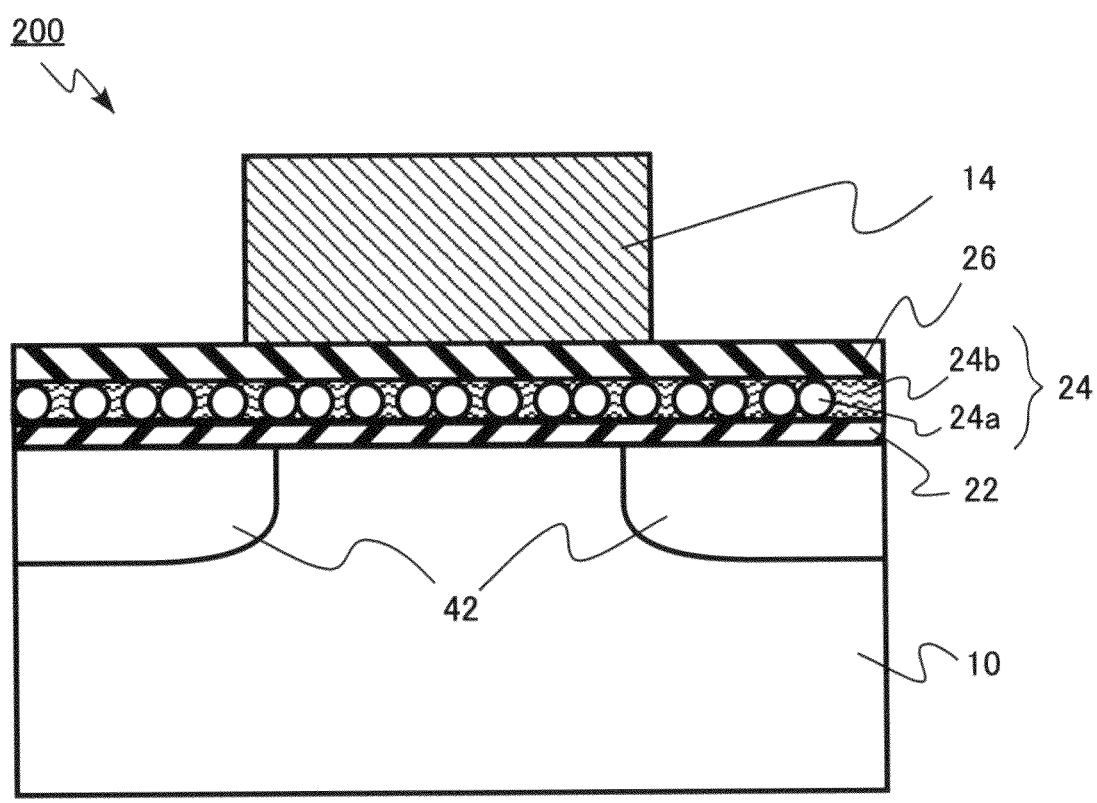
FIG. 12 is a schematic cross-sectional view of a nonvolatile semiconductor memory device according to a third embodiment.

FIG. 12 is a schematic cross-sectional view of the nonvolatile semiconductor memory device according to this embodiment. The nonvolatile semiconductor memory device 200 according to this embodiment has planar NAND memory cell structures. FIG. 12 is a cross-sectional view of a memory cell.

The nonvolatile semiconductor memory device 200 is formed on a p-type silicon semiconductor substrate (a semiconductor layer) 10, for example. A tunnel insulating film (a first insulating film) 22 is formed on the semiconductor substrate (the semiconductor layer) 10, a charge storage film 24 is formed on the tunnel insulating film (a first insulating film) 22, and a block insulating film (a second insulating film) 26 is formed on the charge storage film 24.

A control electrode (a gate electrode) 14 is formed on the block insulating film (the second insulating film) 26. In the portions of the semiconductor substrate (the semiconductor layer) 10 located on both sides of the control electrode (the gate electrode) 14, n-type source/drain diffusion layers 42 are formed, for example.

The charge storage film 24 is a film that includes 060 or C70 fullerenes 24a. Matrix components 24b may exist between the fullerenes 24a.

This embodiment can provide a nonvolatile semiconductor memory device that has a thinner charge storage film while maintaining high charge storage properties. This nonvolatile semiconductor memory device can be easily manufactured by a simple process, as the memory cells are of a planar type.

Fourth Embodiment

A nonvolatile semiconductor memory device of this embodiment includes: a semiconductor layer; a first insulating film formed on the semiconductor layer; a charge storage film that is formed on the first insulating film and includes molecules or clusters, dimers of the molecules or clusters being formed at the time of charge storing; a second insulating film formed on the charge storage film; and a control electrode formed on the second insulating film.

The nonvolatile semiconductor memory device of this embodiment differs from that of the first embodiment in not having fullerenes but having other molecules or clusters contained in the charge storage film. Except for the charge storage film, the structure and the manufacturing method according to this embodiment are basically the same as those according to the first embodiment. Therefore, the same explanations as those in the first embodiment will not be repeated.

Figure 13:
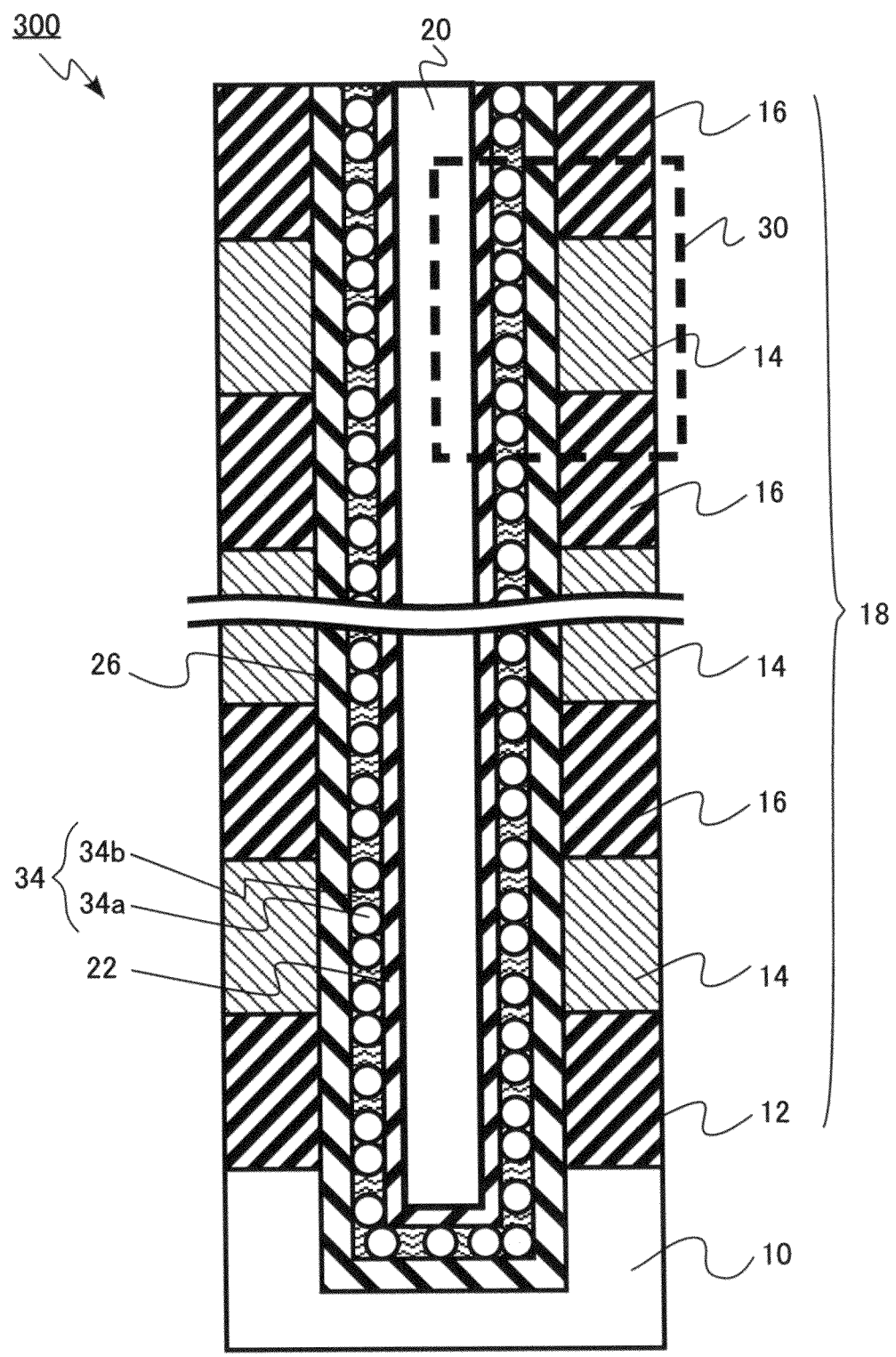
FIG. 13 is a schematic cross-sectional view of a nonvolatile semiconductor memory device according to a fourth embodiment.

FIG. 13 is a schematic cross-sectional view of the nonvolatile semiconductor memory device according to this embodiment. A charge storage film 34 of the nonvolatile semiconductor memory device 300 of this embodiment is a film that includes molecules or clusters 34a. Matrix components 34b may exist between the molecules or clusters 34a. The nonvolatile semiconductor memory device 300 stores charges, as dimers of the molecules or clusters 34a are formed at the time of charge storing.

In this specification, a "cluster" means a fine particle formed with several to two hundreds and several tens of atoms such as metal atoms.

The molecules or clusters 34a may be electrically conductive fine particles of a material such as Ag, Au, Cu, Ru, Pt, W, Ta, Rh, Ir, Os, Pd, Nb, Mo, CuS, CuSe, CuSeTe, AgS, AgSe, CuSe, CuSeTe, GeS, GeSe, GeSeTe, TiO containing oxygen defects, RuO containing oxygen defects, TiN, HfN, Si, Ge, or SiGe. It is also possible to use molecules of a material such as carborane acid, bromocarborane acid, orthocarborane, $B_{12}N_{12}$, $(BN)_{36}$, $B_{15}C_{30}N_{15}$, $[Pd_2@Ge_{18}]^{4-}$, or $(CdSe)_{34}$. It should be noted that $[Pd_2@Ge_{18}]^{4-}$ is a structure that has Pd included in polyhedral molecules of Ge.

More than one kind of material may be used as the above described molecules or clusters 34a. The above molecules or clusters 34a may be made of a mixture of some of the above mentioned materials.

The matrix components 34b can be made of one material or a mixture of some materials or a combination of some materials selected from the following materials: Si, Ge, SiGe, Au, Ag, Cu, Ru, Pt, Hf, Zr, Ti, Al, Mg, fullerenes, TiO, RuO, TiN, HfN, $SiO_2$, SiON, $Al_2O_3$, MgO, $CaF_2$, $La_2O_3$, $HfO_2$, HfAlO, HfSiON, TiO, and the like. The matrix components 34b may be insulators or semiconductors.

In a case where the molecules or clusters 34a are clusters of Ag, Au, Cu, Ru, Pt, W, Ta, Rh, Ir, Os, Pd, Nb, Mo, or the like, the number of atoms in each of the clusters may be 35, 43, 58, 70, 107, 150, or the like, or the clusters may have other numbers of atoms. Particularly, in the case of Au, the above numbers are magic numbers, and are advantageous for forming clusters having uniform particle sizes, as the cluster yield is particularly high with low generation energy.

Clusters with high symmetry tend to require low generation energy. Table 1 shows a list of clusters having yields that become particularly higher as the generation energy becomes lower. It should be noted that clusters having shapes that are not listed in Table 1 can also be used in this embodiment.

TABLE 1

| Unit length | 1 | 2 | 3 | 4 | 5 | 6 | 7 | 8 | 9 |
|---|---|---|---|---|---|---|---|---|---|
| tetrahedron | 1 | 4 | 10 | 20 | 35 | 56 | 84 | 120 | 165 |
| centered tetrahedron | 1 | 5 | 15 | 35 | 69 | 121 | 195 | | |
| cube | 1 | 8 | 27 | 64 | 125 | | | | |
| centered cube | 1 | 9 | 35 | 91 | 189 | | | | |
| octahedron | 1 | 6 | 19 | 44 | 85 | 146 | | | |
| centered icosahedron | 1 | 13 | 55 | 147 | | | | | |
| centered dodecahedron | 1 | 33 | 155 | | | | | | |
| truncated tetrahedron | 1 | 16 | 68 | 180 | | | | | |
| cuboctahedron | 1 | 13 | 55 | 147 | | | | | |
| truncated octahedron | 1 | 38 | 201 | | | | | | |
| truncated v 3 cube | 1 | 56 | | | | | | | |
| triangular prism | 1 | 6 | 18 | 40 | 75 | 126 | 196 | | |
| hexagonal prism | 1 | 14 | 57 | 148 | | | | | |
| rhombic dodecahedron | 1 | 15 | 65 | 175 | | | | | |
| square phyramid | 1 | 5 | 14 | 30 | 55 | 91 | 140 | | |
| tricapped prism | 1 | 9 | 33 | 82 | 165 | | | | |
| hexagonal close packed | 1 | 8 | 26 | 57 | 89 | | | | |

In addition to the clusters having 35, 43, 58, 70, 107, or 150 atoms, and the clusters listed in Table 1, clusters having one atom added to the respective clusters listed above may also be used. In each of such clusters, the binding of the last one atom to the cluster is characteristically weak. Particularly preferable examples include the clusters having 35, 43, 58, 70, 107, or 150 atoms, mixed clusters at a ratio of 1:1 between the clusters listed in Table 1 and the clusters having 35, 43, 58, 70, 107, or 150 atoms or clusters having one atom added to the respective clusters listed in Table 1.

The charge storage film 34 includes the molecules or clusters 34a. The charge storage film 34 may not contain the matrix components 34b, and may contain only the molecules or clusters 34a.

The molecules or clusters 34a are not in a random or disordered or amorphous state, and do not have long-range order like crystals or surface crystals, but preferably have short-range order. The above short-range order is most prominent with nearest-neighbor molecules or clusters, but becomes disordered as the distance between the molecules or clusters become longer.

The above short-range order is preferably formed by formation of dimers of the molecule or clusters 34a. Multimers such as trimers or tetramers may be formed, and the molecules or clusters may be bonded to one another in a network fashion. However, all monomers should not be integrated, or monomers should not have long-range order. Dimers are the most preferable, because the number of charges that can be stored is considered to be 1 even in a trimer or a higher multimer or polymer. If the number of molecules or clusters is the same, the stored charge amount can be maximized by storing charges in dimers.

Particularly, if clusters are linearly bonded to one another to form nanowires (see FIG. 6C), the nanowires need to be prevented from protruding from the channel region or the gate electrode region. In the case of a closest packed structure, for example, it is not preferable to form long-range order like a face-centered cubic structure, a hexagonal closest packed structure, or a surface triangular lattice structure.

In the first embodiment, formation of dimers of fullerenes has been described. However, dimers in the charge storage film 34 can be formed with general molecules or clusters such as fine particles of silver (Ag).

For example, when electrons are injected into one of two adjacent Ag fine particles, an electrical conduction path is formed between the adjacent Ag molecules by soft breakdown caused by an electrical field. Once generated, the small electrical conduction path formed by the soft breakdown between the adjacent Ag molecules repeatedly appears and disappears, depending on injection of electrons. That is, the nonvolatile semiconductor memory device is based on a novel concept that charges are stored into bonds of fine particles (clusters). In this case, the centers of the charge distributions exist in the small electrical conduction path as in the case of fullerenes, and the tunnel insulating film, the block insulating film, or the interlayer insulating films can be made thinner by the increase in the charge storage capacity.

This phenomenon is seen in clusters having 35, 43, 58, 70, 107, or 150 atoms, clusters having 34, 37, 40, 61, 91, or 127 atoms, and the clusters listed in Table 1. The phenomenon is also seen in clusters having one atom added to the above clusters, or clusters having 36, 44, 59, 71, 108, or 151 atoms, clusters having 35, 38, 41, 62, 92, or 128 atoms, and clusters having one atom added to the clusters listed in Table 1.

The phenomenon is particularly prominent in the clusters having 35, 43, 58, 70, 107, or 150 atoms, the clusters having 34, 37, 40, 61, 91, or 127 atoms, and a mixture of clusters at a ratio of 1:1 between the clusters listed in Table 1 and the clusters having one atom added to the clusters having 36 44, 59, 71, 108, or 151 atoms, the clusters having 35, 38, 41, 62, 92, or 128 atoms, and the clusters listed in Table 1. That is, the clusters having 35, 43, 58, 70, 107, or 150 atoms, the clusters having 34, 37, 40, 61, 91, or 127 atoms, and the clusters listed in Table 1 can form pairs, and one atom of the element forming the above clusters can exist in the middle of each of the above pairs.

The molecules or clusters 34a may be oligomers such as trimers or tetramers. In this case, the centers of distributions of the stored electrons exist at the centers of the oligomers such as trimers or tetramers. In the case of a closest packed structure, however, all the molecules or clusters 34 are in the closest state, and all the molecules or clusters 34a form chemical bonds at the time of electron injection or form an electrical conduction path due to soft breakdown. Therefore, a closest packed structure is not preferable.

If the film thickness is 1 monolayer or more, a surface closest packed state appears, and the function of increasing the charge storage capacity is hindered. Therefore, the molecules or clusters 34a in the charge storage film 34 are preferably a monomolecular layer or a monocluster layer, and is preferably less than 1 monolayer. Since dimers or higher multimers or polymers need to be formed, more than one molecule or cluster 34a should exist in the charge storage film 34.

The operating principles of the nonvolatile semiconductor memory device 300 are the same as those of the first embodiment, and therefore, are not described herein.

As for the method of manufacturing the nonvolatile semiconductor memory device 300, the process of forming the charge storage film 34, which differs from the first embodiment, is described in the following.

After the block insulating film 26 is formed inside the hole 40 as in FIG. 9, the charge storage film 34 is formed along the surface of the block insulating film 26.

According to a first formation method, the matrix components 34b are formed with one material or a mixture of some materials or a combination of some materials selected from the following materials: $SiO_2$, $SiON$, $Al_2O_3$, $MgO$, $CaF_2$, $La_2O_3$, $HfO_2$, $HfAlO$, $HfSiON$, $Si$, $Ge$, $TiO$, and the like. After that, the molecules or clusters 34a are formed with Ag, Au, Cu, Ru, Pt, W, Ta, Rh, Ir, Os, Pd, Nb, Mo, CuS, CuSe, CuSeTe, AgS, AgSe, CuSe, CuSeTe, GeS, GeSe, GeSeTe, electrically conductive fine particles (such as TiO containing oxygen defects, RuO containing oxygen defects, TiN, HfN, Si, Ge, or SiGe), a mixture of molecules or clusters of some of the above materials, or molecules or clusters formed by mixing the components of some of the above materials. The matrix components 34b are again formed with one material or a mixture of some materials or a combination of some materials selected from the following materials: $SiO_2$, $SiON$, $Al_2O_3$, $MgO$, $CaF_2$, $La_2O_3$, $HfO_2$, $HfAlO$, $HfSiON$, $Si$, $Ge$, $TiO$, and the like. At this point, the matrix components 34b first formed may have a different composition from that of the matrix components 34b formed later.

According to a second formation method, the matrix components 34b are formed with one material or a combination of some materials selected from the following materials: $SiO_2$, $SiON$, $Al_2O_3$, $MgO$, $CaF_2$, $La_2O_3$, $HfO_2$, $HfAlO$, $HfSiON$, $Si$, $Ge$, $TiO$, and the like. After that, the molecules or clusters 34a are formed with Ag, Au, Cu, Ru, Pt, CuS, CuSe, CuSeTe, AgS, AgSe, CuSe, CuSeTe, GeS, GeSe, GeSeTe, electrically conductive fine particles (such as TiO containing oxygen defects, RuO containing oxygen defects, TiN, HfN, Si, Ge, or SiGe), a mixture of molecules or clusters of some of the above materials, or molecules or clusters formed by mixing the components of some of the above materials. Thereafter, the formation of the matrix components 34b is not repeated.

According to a third formation method, prior to the formation of the matrix components 34b, the molecules or clusters 34a are formed with Ag, Au, Cu, Ru, Pt, electrically conductive fine particles (such as TiO containing oxygen defects, RuO containing oxygen defects, TiN, HfN, Si, Ge, or SiGe), a mixture of molecules or clusters of some of the above materials, or molecules or clusters formed by mixing the components of some of the above materials. After that, the matrix components 34b are formed with one material or a mixture of some materials or a combination of some materials selected from the following materials: $SiO_2$, SiON, $Al_2O_3$, MgO, $CaF_2$, $La_2O_3$, $HfO_2$, HfAlO, HfSiON, Si, Ge, TiO, and the like.

According to a fourth formation method, the matrix components 34b are not formed at all, and the molecules or clusters 34a are formed with Ag, Au, Cu, Ru, Pt, W, Ta, Rh, Ir, Os, Pd, Nb, Mo, CuS, CuSe, CuSeTe, AgS, AgSe, CuSe, CuSeTe, GeS, GeSe, GeSeTe, electrically conductive fine particles (such as TiO containing oxygen defects, RuO containing oxygen defects, TiN, HfN, Si, Ge, or SiGe), a mixture of molecules or clusters of some of the above materials, or molecules or clusters formed by mixing the components of some of the above materials.

The charge storage film 34 is formed by using ALD (Atomic Layer Deposition), for example. The charge storage film 34 can be formed by using any of various film forming methods falling into the category of CVD, such as hot-wall thermal CVD, APCVD (Atmospheric Pressure CVD), LPCVD (Low-Pressure CVD), UHVCVD (UltraHigh Vacuum CVD), AACVD (Aerosol Assisted CVD), DLICVD (Direct Liquid Injection CVD), MPCVD (Microwave Plasma-Assisted CVD), PECVD (Plasma-Enhanced CVD), RPECVD (Remote Plasma-Enhanced CVD), ALCVD (Atomic Layer CVD), HWCVD (Hot Wire CVD), Cat-CVD (Catalytic CVD), HFCVD (Hot Filament CVD), MOCVD (Metalorganic Chemical Vapor Deposition), HPCVD (Hybrid Physical-Chemical Vapor Deposition), RTCVD (Rapid Thermal CVD), VPE (Vapor Phase Epitaxy), thermal CVD, PECVD (Plasma Enhanced CVD), HDPCVD (High Density Plasma Chemical Vapor Deposition), MCVD (Modified Chemical Vapor Deposition), DCVD (Digital Chemical Vapor Deposition), SACVD (Sub-Atmospheric CVD), ECD (Electro Chemical Deposition), ALD (Atomic Layer Deposition), and AVD (Atomic Vapor Deposition).

In a case where the molecules or clusters 34a are molecules, the molecules can be directly used if the boiling point thereof is low. If the boiling point is high, film formation can be facilitated by performing appropriate modification or inclusion.

In a case where the molecules or clusters 34a are clusters, the clusters may be coated with an appropriate self-assembled monomolecular film or the like. Where film formation is performed by a technique falling into the category of ALD or CVD, chelates or the like may be used as the raw material, and reaction intermediates to be fine particles or clusters may be created by causing a gas phase reaction in a reactor by ALD or CVD. The reaction intermediates may be introduced into the substrate.

The matrix components 34b in the charge storage film 34 are also preferably formed by a method falling into the category of ALD or CVD. In a case where matrix components 34b made of a material containing Si, such as $SiO_2$, SiON, HfSiO, or HfSiON are formed, the molecules containing Si atoms may be at least one material selected from the following materials: monosilane, disilane, phenyl groups, diethoxymethylsilane, dimethylmethoxysilane, dimethyldiethoxysilane, methyltrimethoxysilane, methyltriethoxysilane, hexamethyldisiloxane, octamethylcyclotetrasiloxane, 1,1,1,3,3,5,5,5-octamethyltrisiloxane, N,N,N',N',N'',N''-hexamethylsilanetriazine, tetraisocyanatesilane, dimethyldimethoxysilane, tetramethylsilane, trimethylsilane, dimethylsilane, methylsilane, 1,1,3,3-tetramethyl-1,3-disiloxane, trimethoxysilane, trimethylvinylsilane, 1,3,5,7-tetramethylcyclotetrasiloxane, 1,1,1,3,3,3-hexamethyldisilazane, and tetraethoxysilane. Among those materials, it is particularly preferable to use at least one material selected from the following materials: trisdimethylaminosilane (TDMAS), tetraethoxysilane (TEOS), 1,1,1,3,3,3-hexamethyldisilazane (HMDS), isopropylaminosilane, and diisopropylaminosilane. In a case where matrix components 34b made of a material containing Hf, such as HfO, HfSiO, or HfSiON, the molecules containing hafnium atoms may be at least one material selected from the following materials: alkylhafnium compounds such as tetramethylhafnium, tetraethylhafnium, tetrapropylhafnium, tetraisopropylhafnium, tetrabutylhafnium, tetraisobutylhafnium, tetra-sec-butylhafnium, and tetra-tert-butylhafnium; organic acid hafnium or organic acid hafnyl compounds such as hafnium formate, hafnium acetate, hafnium propionate, hafnium butyrate, hafnium isobutyrate, hafnium valerate, hafnium caproate, hafnium caprylate, hafnium 2-ethylhexanoate, hafnium caprate, hafnium neodecanoate, hafnium rosinate, hafnium naphthenate, hafnyl formate, hafnyl acetate, hafnyl propionate, hafnyl butyrate, hafnyl isobutyrate, hafnyl valerate, hafnyl caproate, hafnyl caprylate, hafnyl 2-ethylhexanoate, hafnyl caprate, hafnyl neodecanoate, hafnyl rosinate, and hafnyl naphthenate; alcoxyhafnium compounds such as tetrakis(methoxy)hafnium, tetrakis(ethoxy)hafnium, tetrakis(propoxy)hafnium, tetrakis(isopropoxy)hafnium, tetrakis(butoxy)hafnium, tetrakis(isobutyloxy)hafnium, tetrakis(sec-butyloxy)hafnium, tetrakis(tert-butyloxy)hafnium, tetrakis(amyloxy)hafnium, tetrakis(tert-amyloxy)hafnium, tetrakis[2-(2-methoxy)ethoxy]hafnium, tetrakis[2-(1-methyl-2-methoxy)propoxy]hafnium, tetrakis[2-(2-methoxy)propoxy]hafnium, tetrakis[2-(dimethylamino)ethoxy]hafnium, tetrakis[2-(2-dimethylamino-1-methyl)propoxy]hafnium, tetrakis[2-(2-dimethylamino)propoxy]hafnium, bis(2-propoxy)bis[2-(2-dimethylamino-1-methyl)propoxy]hafnium, bis(tert-butoxy)bis[2-(2-dimethylamino-1-methyl)propoxy]hafnium, bis(tert-butoxy)bis[2-(2-dimethylamino)propoxy]hafnium, (tert-butoxy)tris[2-(2-dimethylamino-1-methyl)propoxy]hafnium, tris(tert-butoxy)[2-(2-dimethylamino-1-methyl)propoxy]hafnium; aminohafnium compounds such as tetrakis(dimethylamino)hafnium, tetrakis(diethylamino)hafnium, tetrakis(ethylmethylamino)hafnium, tetrakis(dipropyl)hafnium, tetrakis(dibutylamino)hafnium, bis(dimethylamino)bis(diethylamino)hafnium, bis(diethylamino)bis(ethylmethylamino)hafnium, and (diethylamino)tris(ethylmethylamino)hafnium; aminohafnium compounds such as bis(methoxy)bis(dimethylamino)hafnium, bis(methoxy)bis(diethylamino)hafnium, bis(methoxy)bis(ethylmethylamino)hafnium, bis(ethoxy)bis(dimethylamino)hafnium, bis(ethoxy)bis(diethylamino)hafnium, bis(ethoxy)bis(ethylmethylamino)hafnium, bis(2-propoxy)bis(diethylamino)hafnium, bis(tert-butyl)bis(diethylamino)hafnium, bis(tert-butyl)bis(ethylmethylamino)hafnium, and (tert-butyl)tris(ethylmethyl)hafnium; hafnium β-diketonate compounds such as: alkyl-substituted β-diketonates such as tetrakisacetylacetonate, tetrakishexane-2,4-dionate, tetrakis-5-methylhexane-2,4-dionate, tetrakisheptane-2,4-dionate, tetrakis-2-methylheptane-3,5-dionate, tetrakis-5-methylheptane-2,4-dionate, tetrakis-6-methylheptane-2,4-dionate, tetrakis-2,2-dimethylheptane-3,5-dionate, tetrakis-2,6-dimethylheptane-3,5-dionate, tetrakis-2,2,6-trimethylheptane-3,5-dionate, tetrakis-2,2,6,6-tetramethylheptane-3,5-dionate, tetrakis-octane-2,4-dionate, tetrakis-2,2,6-trimethyloctane-3,5-dionate, tetrakis-2,6-dimethyloctane-3,5-dionate, tetrakis-2-methyl-6-ethyldecane-3,5-dionate, and tetrakis-2,2-dimethyl-6-ethyldecane-3,5-dionate; fluorine-substituted alkyl β-diketonates such as tetrakis-1,1,1-trifluoropentane-2,4-dionate, tetrakis-1,1,1-trifluoro-5,5-dimethylhexane-2,4-dionate, tetrakis-1,1,1,5,5,5-hexafluoropentane-2,4-dionate, and tetrakis-1,3-diperfluorohexylpropane-1,3-dionate; and ether-substituted β-dikenates such as tetrakis-1,1,5,5-tetramethyl-1-methoxyhexane-2,4-dionate, tetrakis-2,2,6,6-tetramethyl-1-methoxyheptane-3,5-dionate, and tetrakis-2,2,6,6-tetramethyl-1-(2-methoxyethoxy)heptane-3,5-dionate; cyclopentadienyl hafnium compounds such as tetrakis cyclopentadienyl hafnium, tetrakis(methylcyclopentadienyl)hafnium, tetrakis(ethylcyclopentadienyl)hafnium, and tetrakis(pentamethylcyclopentadienyl)hafnium; alkylhafnium compounds; organic acid hafnium compounds; alkoxyhafnium compounds; aminohafnium compounds; hafnium β-diketonate compounds; cyclopentadienyl compounds; hafnium halides such as hafnium tetrachloride; hafnyl chlorides; and hafnium β-diketonate compounds. Among those materials, it is particularly preferable to use at least one material selected from the following materials: hafnium chlorides, tetrakisdimethylaminohafnium (TDMAH), and tetrakisethylmethylaminohafnium (TEMAH). Those materials can be easily vaporized. By introducing those vaporized molecules into a portion near the substrate, a film containing hafnium atoms can be formed.

Molecules containing oxygen atoms may be $O_2$, NO, $NO_2$, $N_2O$, $O_3$, CO, $CO_2$, $H_2O_2$, alcohols, or the like. Among the above materials, it is preferable to use a mixture of some of $O_2$, $O_3$, $H_2O_2$, and alcohols. Other than that, there are cases where it is possible to use molecules containing La, molecules containing Ti, molecules containing Ge, molecules having Si or Hf substituted by La, Ti, Ge, or the like. Also, other chelate molecules can be used.

As described above, this embodiment can provide a nonvolatile semiconductor memory device that has a thinner charge storage film while maintaining high charge storage properties. Also, since such a nonvolatile semiconductor memory device has a three-dimensional structure, high integration can be realized.

Fifth Embodiment

A nonvolatile semiconductor memory device according to this embodiment differs from that of the fourth embodiment in having a three-dimensional structure that is not a three-dimensional structure utilizing the BiCS (Bit-Cost Scalable) technique. The film stack structure of each memory cell, including the charge storage film, is basically the same as that of the fourth embodiment. Therefore, the same explanations as those in the fourth embodiment will not be repeated.

The nonvolatile semiconductor memory device of this embodiment has a three-dimensional structure such as P-BiCS, TCAT, VG-NAND, VC-NAND, cross-point-NAND, VSAT, VRAT, VG-TFT-NAND, DC-SF, PNVG, hybrid 3D, Si pillar 3D NAND, stacked NAND, multi TFT S-SGT, VL-BiCS, STAR-NAND, stacked SONOS, VG-FG-NAND, DSSB TFT, or AAGSONOS.

Since the charge storage film 34 is continuous between adjacent memory cells 30 in the fourth embodiment, the matrix components 34b of the charge storage film 34 need to be insulators or semiconductors. In many of the above described structures, however, the charge storage film 34 is not continuous between adjacent memory cells 30. In such cases, the matrix components 34b of the charge storage film 34 may be electrical conductors.

This embodiment can provide a nonvolatile semiconductor memory device that has a thinner charge storage film while maintaining high charge storage properties. Also, since such a nonvolatile semiconductor memory device has a three-dimensional structure, high integration can be realized.

Sixth Embodiment

A nonvolatile semiconductor memory device according to this embodiment differs from that of the fourth embodiment in having planar NAND memory cell structures. The film stack structure of each memory cell, including the charge storage film, is basically the same as that of the fourth embodiment. Therefore, the same explanations as those in the fourth embodiment will not be repeated.

Figure 14:
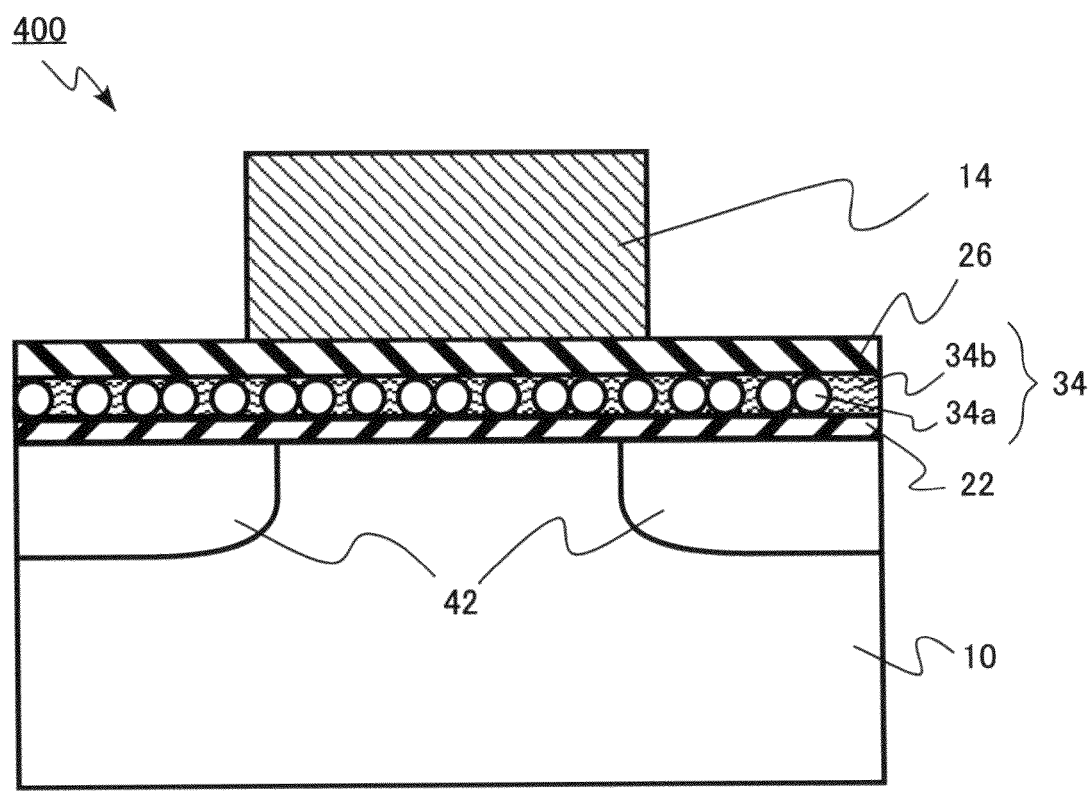
FIG. 14 is a schematic cross-sectional view of a nonvolatile semiconductor memory device according to a sixth embodiment.

FIG. 14 is a schematic cross-sectional view of the nonvolatile semiconductor memory device according to this embodiment. The nonvolatile semiconductor memory device 400 according to this embodiment has planar NAND memory cell structures. FIG. 14 is a cross-sectional view of a memory cell.

The nonvolatile semiconductor memory device 400 is formed on a p-type silicon semiconductor substrate (a semiconductor layer) 10, for example. A tunnel insulating film (a first insulating film) 22 is formed on the semiconductor substrate (the semiconductor layer) 10, a charge storage film 34 is formed on the tunnel insulating film (a first insulating film) 22, and a block insulating film (a second insulating film) 26 is formed on the charge storage film 34.

A control electrode (a gate electrode) 14 is formed on the block insulating film (the second insulating film) 26. In the portions of the semiconductor substrate (the semiconductor layer) 10 located on both sides of the control electrode (the gate electrode) 14, n-type source/drain diffusion layers 42 are formed, for example.

The charge storage film 34 is a film that includes molecules or clusters 34a. Matrix components 34b may exist between the molecules or clusters 34a.

This embodiment can provide a nonvolatile semiconductor memory device that has a thinner charge storage film while maintaining high charge storage properties. This nonvolatile semiconductor memory device can be easily manufactured by a simple process, as the memory cells are of a planar type.

EXAMPLES

In the following, examples of the embodiments are described.

Example 1

A semiconductor memory device 100 according to the first embodiment was manufactured.

Single-crystal Si was used as a semiconductor substrate 10, a $SiO_2$ film was used as a substrate insulating film 12, highly-doped polycrystalline silicon films were used as control electrodes 14, $SiO_2$ films were used as control interelectrode insulating films 16, an $Al_2O_3$ film was used as a block insulating film 26, C70 was used as the fullerene molecules 24a in a charge storage film 24, matrix components 24b were not used in the charge storage film 24, a $SiO_2$ film was used as a tunnel insulating film 22, and a Si layer was used as a semiconductor layer 20. The substrate insulating film 12, the control electrodes 14, and the control interelectrode insulating films 16 were formed on the semiconductor substrate 10.

All the films were formed by CVD, and a heat treatment was performed also to activate the semiconductor layer 20. It was confirmed that the C70 molecules were stable during the above heat treatment, and maintained the polyhedral structure. It was also confirmed that one electron was injected for each two C70 molecules. That is, the C70 molecules form dimers or higher multimers or polymers, and it is considered that inmost cases, one electron is stored in each of the C70 dimers.

Example 2

A semiconductor memory device 100 according to the first embodiment was manufactured.

Single-crystal Si was used as a semiconductor substrate 10, a $SiO_2$ film was used as a substrate insulating film 12, highly-doped polycrystalline silicon films were used as control electrodes 14, $SiO_2$ films were used as control interelectrode insulating films 16, a MgO film was used as a block insulating film 26, C60 was used as fullerene molecules 24a in a charge storage film 24, matrix components 24b in the charge storage film 24 were $SiO_2$, a SiON film was used as a tunnel insulating film 22, and a SiGe layer was used as a semiconductor layer 20. The substrate insulating film 12, the control electrodes 14, and the control interelectrode insulating films 16 were formed on the semiconductor substrate 10.

All the films were formed by CVD, and a heat treatment was performed also to activate the semiconductor layer 20. It was confirmed that the C60 molecules were stable during the above heat treatment, and maintained the polyhedral structure. However, the dispersion of the C60 molecules was slightly biased, compared with that of the C70 molecules. One electron was stored for each three C60 molecules, and dimers or higher multimers or polymers of the C60 molecules were formed. It is considered that in most cases, one electron is stored in each of the dimers.

Example 3

A semiconductor memory device 300 according to the fourth embodiment was manufactured.

A substrate formed by epitaxially growing SiGe on single-crystal Si was used as a semiconductor substrate 10, a SiOC film was used as a substrate insulating film 12, CoSi films were used as control electrodes 14, SiOC films were used as control interelectrode insulating films 16, a LaAlO film was used as a block insulating film 26, Ag clusters were used as clusters 34a in a charge storage film 34, Si was used as matrix components 34b in the charge storage film 24, a $SiO_2$ film was used as a tunnel insulating film 22, and an InSbP layer was used as a semiconductor layer 20. The substrate insulating film 12, the control electrodes 14, and the control interelectrode insulating films 16 were formed on the semiconductor substrate 10.

The films were formed by CVD and MBE, and a heat treatment was performed also to activate the semiconductor layer 20. The Ag clusters were approximately 1 nm in diameter, and included many clusters, the numbers of Ag atoms in which were 55, 56, 58, 59, 64, 65, 71, 72, 75, 76, 92, 93, 107, 108, 130, 131, 138, 139, 147, 148, 150, and 151.

However, there existed not only clusters having the above numbers of atoms but also clusters having other numbers of atoms. Particularly, in the case of Ag, clusters having 75 atoms are stable, and such clusters are slightly smaller than 1 nm in diameter, which is convenient. Those clusters are not necessarily spherical in shape. Instead, those clusters may have hemispherical shapes, being flat at the contact portions with the film forming surface. Alternatively, those clusters may have disk-like shapes or elliptical shapes extending in the in-plane direction. In the charge storage film, near-neighbor cluster pairs were observed.

In a case where electrons are injected into one of the clusters, and each cluster approximates a conductive sphere, the electric field between the adjacent clusters is determined according to the following equation (1):

$$E = \frac{e}{\sqrt{2}\,\pi\varepsilon_0 d\sqrt{d^2 - r^2}} \left( \sum_{n=0}^{\infty} \frac{2n+1}{2\sinh((n+1/2)\cosh^{-1}(d/r))} \int_{-1}^{1} \frac{P_n(x)}{\sqrt{(d/r)-x}}\,dx \right) \quad (1)$$

where d represents the center-to-center distance between the adjacent clusters, r represents the radius of each cluster approximating a conductive sphere, e represents the elementary charge amount of electrons, and $\varepsilon_0$ represents the permittivity of vacuum.

In a case where clusters of 0.5 nm in radius are adjacent to each other at a distance of 0.2 nm, for example, the electric field is as strong as 18 MV/cm. Since clusters are smaller in reality, the electric field becomes even stronger by virtue of the effect of the non-spherical shapes of clusters, which depend on the atoms forming the clusters. Therefore, soft breakdown occurs between the adjacent clusters, and a conductive path with higher electrical conductivity than the other matrix regions is formed. As a result, the adjacent clusters dimerize.

The electrons injected into such dimerized clusters have distributions around the conductive path, and the mean position of the electrons is outside the clusters. Such a phenomenon preferably occurs in a case where each cluster pair is formed with a stable cluster and a cluster having one more atom than the stable cluster.

Example 4

A semiconductor memory device 300 according to the fourth embodiment was manufactured.

A SOI (Silicon On Insulator) substrate was used as a semiconductor substrate 10, a SiOC film was used as a substrate insulating film 12, silicide films were used as control electrodes 14, metal-containing $SiO_2$ films were used as control interelectrode insulating films 16, a film formed by stacking TaO and HfO was used as a block insulating film 26, CuS was used as clusters 34a in a charge storage film 34, $SiO_2$ was used as matrix components 34b in the charge storage film 34, a $SiO_2$ film was used as a tunnel insulating film 22, and an IGZO (InGaZnO) layer was used as a semiconductor layer 20. The substrate insulating film 12, the control electrodes 14, and the control interelectrode insulating films 16 were formed on the semiconductor substrate 10. The IGZO can be replaced with HIGO (HfInZnO) or InMgO. HIGO has the advantage of better compatibility with HfO insulators. InMgO has the advantage of not containing the volatile Zn elements which make difficult to treat the film producing vacuum apparatus.

All the films were formed by CVD.

It was confirmed that, by electron injection through the tunnel film, a filament made of CuS was formed between each two adjacent CuS clusters, and dimers were formed. There may exist trimers or higher multimeres or polymers, but not all the clusters are linked.

Example 5

A semiconductor memory device according to the fifth embodiment was manufactured. This semiconductor memory device is a so-called VG (vertical gate)-NAND device.

Stack structures formed with SiO$_2$ layers and Si layers were formed on a silicon substrate. By forming grooves that reached the silicon substrate, plate-like structures formed with the stack structures vertically standed on the silicon substrate. After that, a SiON tunnel insulating film was formed, for example. A charge storage film that contained molecules or clusters and had short-range order, instead of long-range order, was formed.

An Al$_2$O$_3$ block film was then formed, for example. Si gate electrodes were formed, and activation regions were formed by processing the Si gate electrodes. In this manner, the charge storage film that contained the molecules or clusters, and had short-range order, instead of long-range order, was formed in a nonvolatile semiconductor memory device in which the channels extended parallel to the substrate, and the gate electrodes were arranged perpendicularly to the substrate.

The embodiments of the present disclosure have been described so far, with reference to specific examples. The above described embodiments are merely examples, and do not limit the disclosure. In the above embodiments of nonvolatile semiconductor memory devices, methods of manufacturing the nonvolatile semiconductor memory devices, and the like, the aspects that are not relevant to the present disclosure have not been described. However, those aspects may be selectively used in nonvolatile semiconductor memory devices and methods of manufacturing the nonvolatile semiconductor memory devices, if necessary.

Nonvolatile semiconductor memory devices that include the elements of the present disclosure and can be designed and modified by those skilled in the art should fall within the scope of the disclosure. The scope of the disclosure is defined by the claims and equivalents thereof.

While certain embodiments have been described, these embodiments have been presented by way of example only, and are not intended to limit the scope of the inventions. Indeed, the nonvolatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a semiconductor layer;
    a first insulating film formed on the semiconductor layer;
    a charge storage film formed on the first insulating film, the charge storage film comprising C60 fullerenes;
    a second insulating film formed on the charge storage film; and
    a control electrode formed on the second insulating film,
    wherein the C60 fullerenes have two molecules short-range order, and do not have long-range order.

2. The device according to claim 1, wherein the charge storage film is not less than 0.5 monolayer and is less than 1.0 monolayer.

3. A nonvolatile semiconductor memory device, comprising:
    a semiconductor layer;
    a first insulating film formed on the semiconductor layer;
    a charge storage film formed on the first insulating film, the charge storage film comprising C60 fullerenes, the charge storage film being not less than 0.5 monolayer and being less than 1.0 monolayer;
    a second insulating film formed on the charge storage film; and
    a control electrode formed on the second insulating film,
    wherein dimers of the C60 fullerenes are formed when charges are stored in the charge storage film.

4. The device according to claim 1, wherein the charge storage film comprises a matrix component between the C60 fullerenes.

5. A nonvolatile semiconductor memory device, comprising:
    a semiconductor layer;
    a first insulating film formed on the semiconductor layer;
    a charge storage film formed on the first insulating film, the charge storage film comprising C60 fullerenes, the charge storage film being not less than 0.5 monolayer and being less than 1.0 monolayer;
    a second insulating film formed on the charge storage film; and
    a control electrode formed on the second insulating film,
    wherein the semiconductor layer comprises one of polycrystalline silicon, IGZO (InGaZnO), HIZO (HfInZnO), and InMgO.

6. The device according to claim 1, wherein the first insulating film comprises one of SiO$_2$, SiON, HfSiO, and parylene.

7. The device according to claim 1, wherein the second insulating film at least one material selected from the group consisting of SiO$_2$, SiN, Al$_2$O$_3$, MgO, CaF$_2$, La$_2$O$_3$, and HfO$_2$.

8. The device according to claim 1, wherein the control electrode comprises one of polycrystalline silicon, tantalum (Ta), and a tantalum compound.

9. A nonvolatile semiconductor memory device, comprising:
    a semiconductor layer;
    a first insulating film formed on the semiconductor layer;
    a charge storage film formed on the first insulating film, the charge storage film comprising C70 fullerenes;
    a second insulating film formed on the charge storage film; and
    a control electrode formed on the second insulating film,
    wherein the C70 fullerenes have two molecules short-range order, and do not have long-range order.

10. The device according to claim 9, wherein the charge storage film is not less than 0.5 monolayer and is less than 1.0 monolayer.

11. A nonvolatile semiconductor memory device, comprising:
    a semiconductor layer;
    a first insulating film formed on the semiconductor layer;
    a charge storage film formed on the first insulating film, the charge storage film comprising C70 fullerenes, the charge storage film being not less than 0.3 monolayer and being not more than 0.5 monolayer;
    a second insulating film formed on the charge storage film; and
    a control electrode formed on the second insulating film,
    wherein dimers of the C70 fullerenes are formed when charges are stored in the charge storage film.

12. The device according to claim 9, wherein the charge storage film comprises a matrix component between the C70 fullerenes.

13. A nonvolatile semiconductor memory device, comprising:
    a semiconductor layer;
    a first insulating film formed on the semiconductor layer;

a charge storage film formed on the first insulating film, the charge storage film comprising C70 fullerenes, the charge storage film being not less than 0.3 monolayer and being not more than 0.5 monolayer;

a second insulating film formed on the charge storage film; and a control electrode formed on the second insulating film, wherein the semiconductor layer comprises one of polycrystalline silicon, IGZO (InGaZnO) HIZO (HfInZnO), and InMgO.

14. The device according to claim 9, wherein the first insulating film comprises one of $SiO_2$, SiON, HfSiO, and parylene.

15. The device according to claim 9, wherein the second insulating film comprises at least one material selected from the group consisting of $SiO_2$, SiN, $Al_2O_3$, MgO, $CaF_2$, $La_2O_3$, and $HfO_2$.

16. The device according to claim 9, wherein the control electrode comprises one of polycrystalline silicon, tantalum (Ta), and a tantalum compound.

17. A nonvolatile semiconductor memory device, comprising:

a semiconductor layer;

a first insulating film formed on the semiconductor layer;

a charge storage film formed on the first insulating film, the charge storage film comprising molecules or clusters, dimers of the molecules or the clusters being formed when charges are stored in the charge storage film;

a second insulating film formed on the charge storage film; and a control electrode formed on the second insulating film.

18. The device according to claim 17, wherein the clusters are electrically conductive fine particles comprising at least one selected from the group consisting of Ag, Au, Cu, Ru, Pt, W, Ta, Rh, Ir, Os, Pd, Nb, Mo, CuS, CuSe, CuSeTe, AgS, AgSe, CuSe, CuSeTe, GeS, GeSe, GeSeTe, TiO containing oxygen defects, RuO containing oxygen defects, TiN, HfN, Si, Ge, and SiGe.

19. A nonvolatile semiconductor memory device, comprising:

a semiconductor layer;

a first insulating film formed on the semiconductor layer;

a charge storage film formed on the first insulating film, the charge storage film comprising molecules or clusters, dimers of the molecules or the clusters being formed when charges are stored in the charge storage film;

a second insulating film formed on the charge storage film; and a control electrode formed on the second insulating film, wherein the molecules are of carborane acid, bromocarborane acid, orthocarborane, $B_{12}N_{12}$, $(BN)_{36}$, $B_{15}C_{30}N_{15}$, $[Pd_2@Ge_{18}]^{4-}$, or $(CdSe)_{34}$.

20. The device according to claim 17, wherein the charge storage film comprises a matrix component between the molecules or the clusters.

21. The device according to claim 17, wherein the molecules or clusters have short-range order, and do not have long-range order.

22. The device according to claim 21, wherein the clusters are electrically conductive fine particles comprising at least one selected from the group consisting of Ag, Au, Cu, Ru, Pt, W, Ta, Rh, Ir, Os, Pd, Nb, Mo, CuS, CuSe, CuSeTe, AgS, AgSe, CuSe, CuSeTe, GeS, GeSe, GeSeTe, TiO containing oxygen defects, RuO containing oxygen defects, TiN, HfN, Si, Ge, and SiGe.

23. The device according to claim 17, wherein the semiconductor layer comprises one of polycrystalline silicon, IGZO (InGaZnO) HIZO (HfInZnO), and InMgO.

* * * * *